US009768250B2

(12) United States Patent
Yoon et al.

(10) Patent No.: US 9,768,250 B2
(45) Date of Patent: Sep. 19, 2017

(54) SEMICONDUCTOR DEVICES INCLUDING GATE CONTACTS

(71) Applicants: Changseop Yoon, Yangsan-si (KR); Hyokki Kwon, Hwaseong-si (KR); Min Choul Kim, Hwaseong-si (KR)

(72) Inventors: Changseop Yoon, Yangsan-si (KR); Hyokki Kwon, Hwaseong-si (KR); Min Choul Kim, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/055,666

(22) Filed: Feb. 29, 2016

(65) Prior Publication Data

US 2016/0284799 A1    Sep. 29, 2016

(30) Foreign Application Priority Data

Mar. 25, 2015    (KR) .................. 10-2015-0041667

(51) Int. Cl.
| | |
|---|---|
| *H01L 29/76* | (2006.01) |
| *H01L 29/06* | (2006.01) |
| *H01L 27/092* | (2006.01) |
| *H01L 29/417* | (2006.01) |
| *H01L 29/45* | (2006.01) |
| *H01L 21/8238* | (2006.01) |

(52) U.S. Cl.
CPC ...... *H01L 29/0653* (2013.01); *H01L 27/0924* (2013.01); *H01L 29/41791* (2013.01); *H01L 29/45* (2013.01); *H01L 21/823871* (2013.01)

(58) Field of Classification Search
CPC .... H01L 33/483; H01L 33/642; H02M 7/003; H02S 40/42; H05K 1/0206
USPC ............................................... 257/369
See application file for complete search history.

(56) References Cited

U.S. PATENT DOCUMENTS

| | | | |
|---|---|---|---|
| 7,179,713 | B2 | 2/2007 | Lee |
| 8,258,577 | B2 | 9/2012 | Dixit |
| 8,791,509 | B2 | 7/2014 | Beyer et al. |
| 8,809,920 | B2 | 8/2014 | Khakifirooz et al. |
| 8,906,793 | B2 | 12/2014 | Kanakasabapathy et al. |
| 8,916,441 | B2 | 12/2014 | Rashed et al. |
| 9,105,498 | B2 | 8/2015 | Bajaj et al. |
| 9,385,127 | B2 * | 7/2016 | Lin ................ H01L 21/8238 |
| 2011/0147840 | A1 | 6/2011 | Cea et al. |
| 2014/0252496 | A1 | 9/2014 | Liu et al. |
| 2014/0306286 | A1 | 10/2014 | Chang et al. |
| 2016/0027703 | A1 * | 1/2016 | Do ............... H01L 27/0207 |
| | | | 257/369 |

* cited by examiner

*Primary Examiner* — Andy Huynh
(74) *Attorney, Agent, or Firm* — Myers Bigel, P.A.

(57) ABSTRACT

A semiconductor device includes a substrate. The semiconductor device includes a gate electrode on the substrate. The semiconductor device includes a gate contact on the gate electrode. In some embodiments, a fin-shaped body protrudes from the substrate, and the gate electrode is on the fin-shaped body. Moreover, in some embodiments, the gate contact is partially in the gate electrode.

20 Claims, 38 Drawing Sheets

SEMICONDUCTOR DEVICES INCLUDING GATE CONTACTS

CROSS-REFERENCE TO RELATED APPLICATION

This U.S. non-provisional patent application claims priority under 35 U.S.C. §119 to Korean Patent Application No. 10-2015-0041667, filed on Mar. 25, 2015, in the Korean Intellectual Property Office, the entire contents of which are hereby incorporated herein by reference.

BACKGROUND

The present disclosure relates to semiconductor devices. Due to characteristics including small size, multiple functions, and/or low cost, semiconductor devices have been esteemed as important elements in the electronic industry. Semiconductor devices may be classified into a memory device for storing data, a logic device for processing data, and a hybrid device including both memory and logic elements. To meet increased demand for electronic devices with fast speed and/or low power consumption, it may be helpful to provide semiconductor devices with high reliability, high performance, and/or multiple functions. To satisfy these technical specifications/requirements, the complexity and/or integration density of semiconductor devices have increased.

SUMMARY

Example embodiments of present inventive concepts may provide a semiconductor device with an improved resistance property and a method of fabricating the same. Some example embodiments may provide a method of relatively easily fabricating a semiconductor device, and a semiconductor device fabricated thereby.

According to some example embodiments of present inventive concepts, a semiconductor device may include a substrate including active patterns defined by a device isolation layer. The active patterns may extend along a direction. The semiconductor device may include a gate electrode on the active patterns and the device isolation layer. The semiconductor device may include a gate contact on the device isolation layer between the active patterns and connected to the gate electrode. The gate contact may include a body portion in contact with the gate electrode and an extended portion extending from the body portion toward the device isolation layer along a sidewall of the gate electrode.

In some example embodiments, the body portion may have a bottom surface lower than a top surface of the gate electrode. In some example embodiments, each of the active patterns may include an active fin exposed by the device isolation layer, and the extended portion may have a bottom surface lower than a top surface of the active fin. Moreover, the bottom surface of the extended portion may be at a higher level than a top surface of the device isolation layer.

According to some example embodiments, the semiconductor device may include a gate spacer on the sidewall of the gate electrode. At least a portion of the gate spacer may be interposed between the sidewall of the gate electrode and the extended portion. In some example embodiments, the semiconductor device may include an interlayer insulating layer adjacent the gate electrode and the gate spacer. The gate contact may penetrate the interlayer insulating layer and may be connected to the gate electrode, and at least a portion of the interlayer insulating layer may be interposed between the sidewall of the gate electrode and the extended portion. Moreover, the semiconductor device may include a gate insulating pattern between the sidewall of the gate electrode and the gate spacer. The gate insulating pattern may extend between the gate electrode and the substrate.

In some example embodiments, the extended portion may be a first extended portion, and the gate contact may include a second extended portion extending toward the device isolation layer along an opposite sidewall of the gate electrode. In some example embodiments, the semiconductor device may include gate spacers on both sidewalls of the gate electrode. One of the gate spacers may be interposed between the first extended portion and the gate electrode, and the other one of the gate spacers may be interposed between the second extended portion and the gate electrode.

According to some example embodiments, the semiconductor device may include an interlayer insulating layer adjacent the gate electrode and the gate spacers. The gate contact may penetrate the interlayer insulating layer and may be connected to the gate electrode, and at least a portion of the interlayer insulating layer may be interposed between the first extended portion and the gate electrode and between the second extended portion and the gate electrode.

In some example embodiments, the semiconductor device may include a gate insulating pattern between the substrate and the gate electrode. The gate insulating pattern may extend between both sidewalls of the gate electrode and the gate spacers.

According to some example embodiments, the direction along which the active patterns extend may be a first direction. The active patterns may be spaced apart from each other in a second direction that intersects the first direction. The gate electrode may include a plurality of gate electrodes extending in the second direction and spaced apart from each other in the first direction. The gate contact may extend in the first direction and may be connected to each of the plurality of gate electrodes. The body portion of the gate contact may extend in the first direction and may be in contact with the plurality of gate electrodes. Moreover, the extended portion of the gate contact may include a plurality of extended portions, each extending toward the device isolation layer between the gate electrodes.

In some example embodiments, the semiconductor device may include source/drain regions on the active patterns at both sides of the gate electrode, and source/drain contacts connected to the source/drain regions. The gate contact may have a top surface coplanar with top surfaces of the source/drain contacts. In some example embodiments, the source/drain contacts and the gate contact may include substantially the same material. Moreover, the semiconductor device may include conductive patterns between the source/drain regions and the source/drain contacts. The source/drain contacts may be electrically connected to the source/drain regions through the conductive patterns.

A semiconductor device, according to some example embodiments, may include a gate electrode on a substrate. The semiconductor device may include a gate spacer on a sidewall of the gate electrode. The semiconductor device may include an interlayer insulating layer on the gate electrode and the gate spacer, and a gate contact penetrating the interlayer insulating layer and being connected to the gate electrode. The gate contact may include a body portion in contact with of the gate electrode and an extended portion extending toward the substrate along the sidewall of the gate electrode, and at least a portion of the gate spacer and at least a portion of the interlayer insulating layer may be interposed between the gate electrode and the extended portion of the gate contact.

In some example embodiments, a bottom surface of the body portion of the gate contact may be at a lower level than a top surface of the gate electrode. In some example embodiments, the semiconductor device may include a device isolation layer on the substrate to define an active pattern. The gate electrode may extend over the active pattern and the device isolation layer, and the gate contact may be on the device isolation layer.

According to some example embodiments, the active pattern may have a top surface exposed by the device isolation layer. A first level of a bottom surface of the extended portion of the gate contact may be lower than a second level of a top surface of the active pattern and may be higher than a third level of a top surface of the device isolation layer. Moreover, the semiconductor device may include source/drain regions on the active pattern at both sides of the gate electrode, and source/drain contacts connected to the source/drain regions. A top surface of the gate contact may be coplanar with top surfaces of the source/drain contacts.

A semiconductor device, according to some example embodiments, may include a substrate having a fin-shaped body protruding therefrom. The semiconductor device may include a gate electrode on the fin-shaped body. The semiconductor device may include a gate contact that is partially in the gate electrode and partially outside the gate electrode. In some embodiments, a portion of the gate contact may be in a recess of the gate electrode. In some embodiments, the portion of the gate contact may be on three surfaces of the gate electrode.

In some example embodiments, the semiconductor device may include an insulating layer, and the portion of the gate contact that is in the recess of the gate electrode may be a first portion of the gate contact. The gate contact may include a second portion that is in the insulating layer.

According to some example embodiments, the fin-shaped body may be a first fin-shaped body that is in a PMOSFET region of the semiconductor device, and the semiconductor device may include a second fin-shaped body that is in an NMOSFET region of the semiconductor device. The gate contact may extend between the first and second fin-shaped bodies of the PMOSFET and NMOSFET regions, respectively, when viewed in a plan view.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

Figure 1:
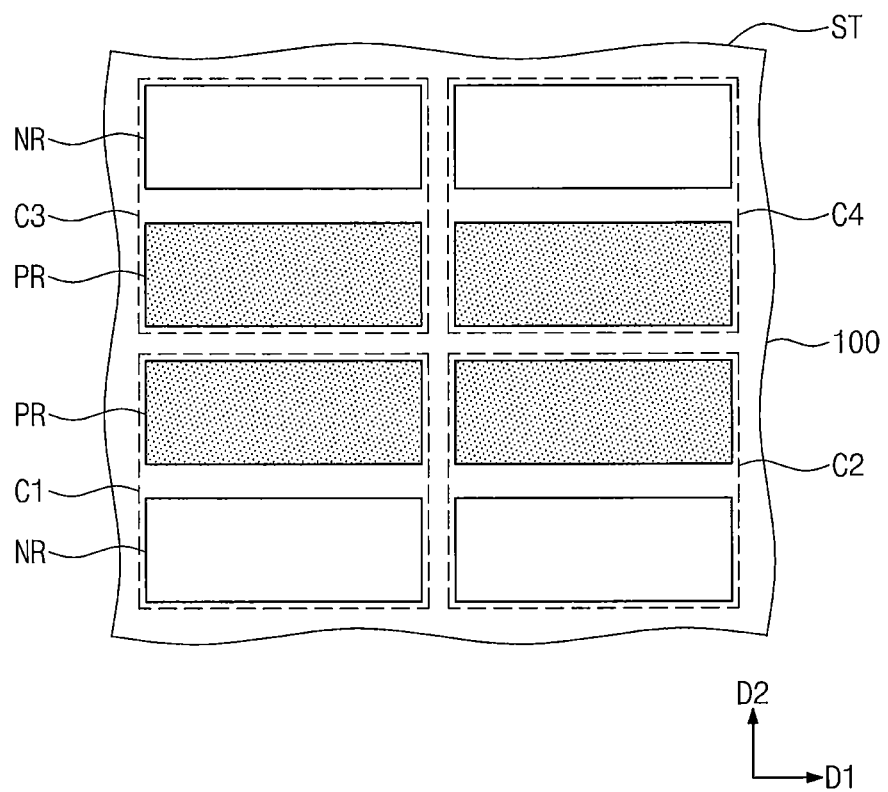
FIG. 1 is a plan view illustrating a semiconductor device according to some example embodiments of present inventive concepts.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments are described below with reference to the accompanying drawings. Many different forms and embodiments are possible without deviating from the spirit and teachings of this disclosure and so the disclosure should not be construed as limited to the example embodiments set forth herein. Rather, these example embodiments are provided so that this disclosure will be thorough and complete, and will convey the scope of the disclosure to those skilled in the art. In the drawings, the sizes and relative sizes of layers and regions may be exaggerated for clarity. Like reference numbers refer to like elements throughout the description.

The terminology used herein is for the purpose of describing particular embodiments only and is not intended to be limiting of the embodiments. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of the stated features, steps, operations, elements, and/or components, but do not preclude the presence or addition of one or more other features, steps, operations, elements, components, and/or groups thereof.

It will be understood that when an element is referred to as being "coupled," "connected," or "responsive" to, or "on," another element, it can be directly coupled, connected, or responsive to, or on, the other element, or intervening elements may also be present. In contrast, when an element is referred to as being "directly coupled," "directly connected," or "directly responsive" to, or "directly on," another element, there are no intervening elements present. As used herein the term "and/or" includes any and all combinations of one or more of the associated listed items.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein may be interpreted accordingly.

Example embodiments of present inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of present inventive concepts should not be construed as limited to the particular shapes of regions illustrated herein but are to include deviations in shapes that result, for example, from manufacturing. Accordingly, the regions illustrated in the figures are schematic in nature and their shapes are not intended to illustrate the actual shape of a region of a device and are not intended to limit the scope of example embodiments.

It will be understood that although the terms "first," "second," etc. may be used herein to describe various elements, these elements should not be limited by these terms. These terms are only used to distinguish one element from another. Thus, a "first" element could be termed a "second" element without departing from the teachings of the present embodiments.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

As appreciated by the present inventive entity, devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

FIG. 1 is a plan view illustrating a semiconductor device according to some example embodiments of present inventive concepts.

Referring to FIG. 1, a semiconductor device according to some example embodiments of present inventive concepts may include a plurality of logic cells C1, C2, C3, and C4 provided on a substrate. Each of the logic cells C1, C2, C3, and C4 may include a plurality of transistors. As an example, the semiconductor device may include a first logic cell C1, a second logic cell C2 spaced apart from the first logic cell C1 in a first direction D1, a third logic cell C3 spaced apart from the first logic cell C1 in a second direction D2 crossing the first direction D1, and a fourth logic cell C4 spaced apart from the second logic cell C2 in the second direction D2. Each of the logic cells C1, C2, C3, and C4 may include active regions separated apart from each other by a device isolation layer ST. The active regions may include a PMOSFET region PR and an NMOSFET region NR separated apart from each other by the device isolation layer ST.

As an example, the PMOSFET region PR and the NMOSFET region NR may be spaced apart from each other in the second direction D2. The PMOSFET region PR of the first logic cell C1 may be positioned adjacent to the PMOSFET region PR of the second logic cell C2 in the first direction D1. In the present application, the logic cell may refer to a unit configured to perform a Boolean logic function (e.g., as in an INVERTER circuit, an AND circuit, an OR circuit, a NAND circuit, a NOR circuit, and so forth) or a storage function (e.g., as in a FLIP-FLOP circuit). Further, the number of the logic cells may be variously changed from that illustrated in the drawing.

Figure 2:
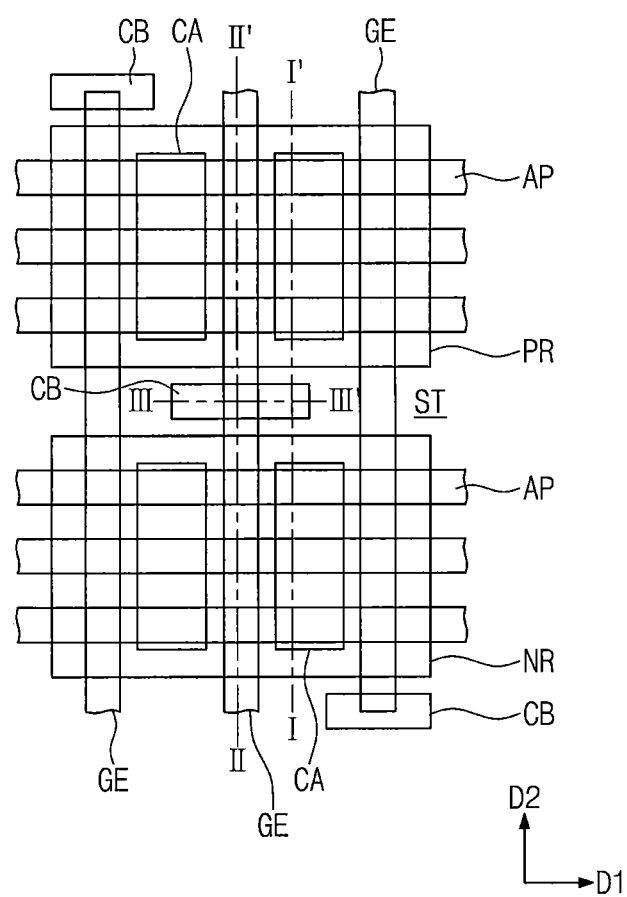
FIG. 2 is a plan view illustrating a portion (e.g., corresponding to the first logic cell C1 of FIG. 1) of a semiconductor device according to some example embodiments of present inventive concepts.
Figure 3A:
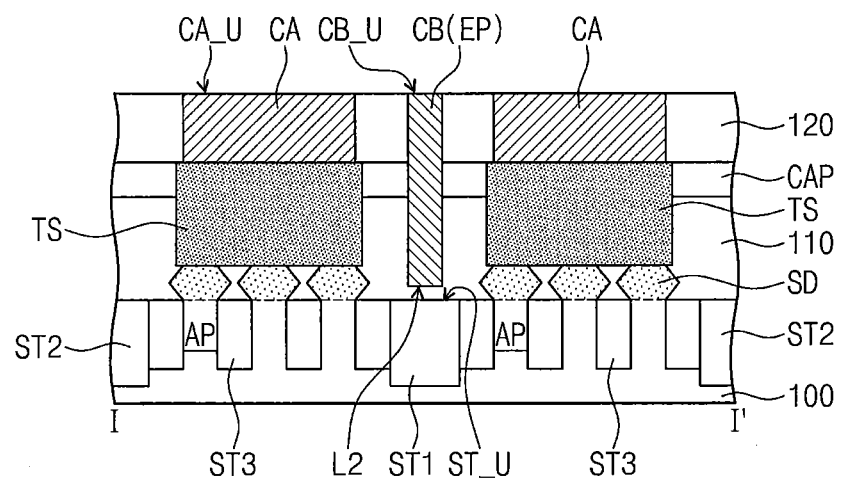
FIGS. 3A, 3B, and 3C are sectional views taken along lines I-I', II-II', and III-III', respectively, of FIG. 2.
Figure 3B:
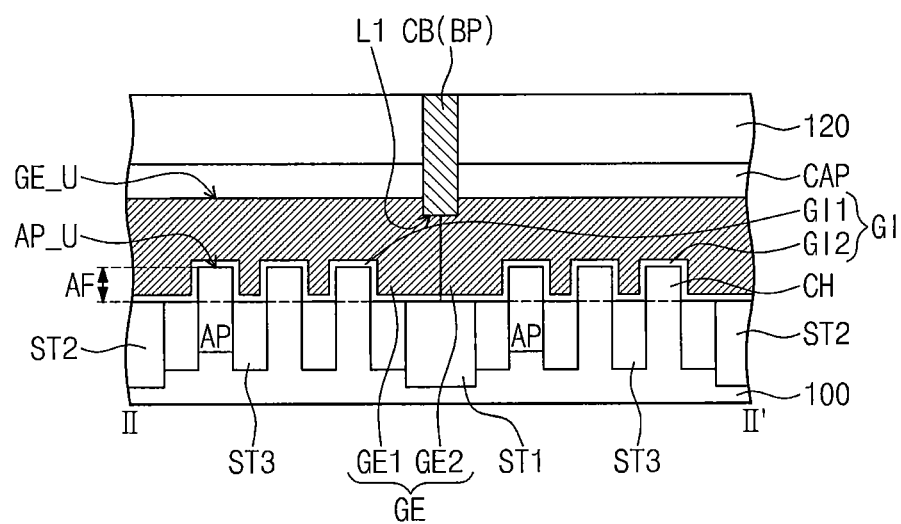
Figure 3C:
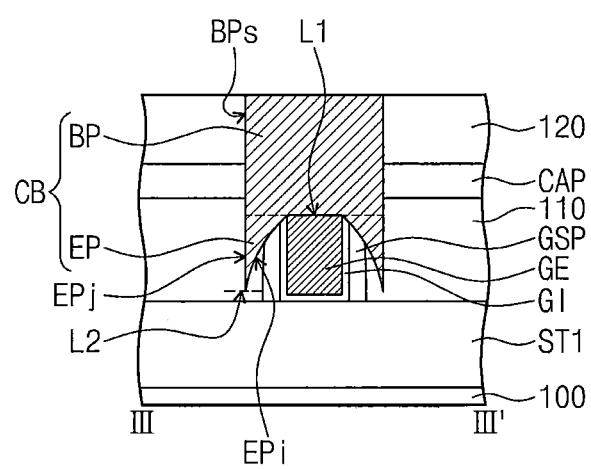

FIG. 2 is a plan view illustrating a portion (e.g., corresponding to the first logic cell C1 of FIG. 1) of a semiconductor device according to some example embodiments of present inventive concepts. FIGS. 3A, 3B, and 3C are sectional views taken along lines I-I', II-II', and III-III', respectively, of FIG. 2. The present inventive entity appreciates that although some embodiments of present inventive concepts will be described herein with reference to the first logic cell C1 of FIG. 1, the other logic cells of FIG. 1 may have substantially the same or similar structure as that of the first logic cell C1.

Referring to FIGS. 1, 2, 3A, 3B, and 3C, the first logic cell C1 may include the PMOSFET region PR and the NMOSFET region NR spaced apart from each other by the device isolation layer ST. Further, the first logic cell C1 may be isolated from neighboring logic cells C2, C3, and C4 by the device isolation layer ST. The device isolation layer ST may include a first device isolation layer ST1 and a second device isolation layer ST2. The first device isolation layer ST1 may separate the PMOSFET region PR from the NMOSFET region NR, and the second device isolation layer ST2 may separate the first logic cell C1 from the neighboring logic cells C2, C3, and C4. The first device isolation layer ST1 may be connected to the second device isolation layers ST2 to form a single continuous insulating layer. The device isolation layer ST may be formed in a top portion of the substrate 100. In example embodiments, the substrate 100 may be a silicon substrate, a germanium substrate, or a silicon-on-insulator (SOI) substrate. The device isolation layer ST may be formed of or include a silicon oxide layer.

In example embodiments, the PMOSFET and NMOSFET regions PR and NR may be spaced apart from each other in the second direction D2 with the first device isolation layer ST1 interposed therebetween. Although each of the PMOSFET and NMOSFET regions PR and NR is shown to be a single region, it may include a plurality of regions which are separated apart from each other by the first device isolation layer ST1.

The first logic cell C1 may include a plurality of active patterns AP which are provided on the substrate 100 to extend parallel to the first direction D1. The active patterns AP may be arranged in the second direction D2. In example embodiments, third device isolation layers ST3 extending in the first direction D1 may be provided at both sides of each of the active patterns AP. In example embodiments, each of the active patterns AP may include an upper portion (hereinafter, active fin AF) exposed by (e.g., protruding beyond) the third device isolation layers ST3, but example embodiments of present inventive concepts may not be limited thereto. For example, the active patterns AP may have top surfaces substantially coplanar with those of the third device isolation layers ST3.

The first, second, and third device isolation layers ST1, ST2, and ST3 may have a difference in depth therebetween or in vertical positions of their bottom surfaces. In example embodiments, the third device isolation layers ST3 may have a depth smaller (e.g., shallower) than those of the first and second device isolation layers ST1 and ST2. In this case, the third device isolation layers ST3 may be formed by a process different from that for the first and second device isolation layers ST1 and ST2. In some example embodiments, the third device isolation layers ST3 may be formed at the same time when the first and second device isolation layers ST1 and ST2 are formed. In this case, the first, second, and third device isolation layers ST1, ST2, and ST3 may have substantially the same depth.

The active patterns AP may be provided on each of the PMOSFET and NMOSFET regions PR and NR. As shown in FIG. 2, three active patterns AP may be provided on each of the active regions PR and NR, but example embodiments of present inventive concepts may not be limited thereto.

Gate electrodes GE may be provided on the active patterns AP to cross the active patterns AP and extend in the second direction D2. The gate electrodes GE may be arranged in the first direction D1.

Each of the gate electrodes GE may extend parallel to the second direction D2, thereby crossing the PMOSFET and NMOSFET regions PR and NR. Gate insulating patterns GI may be provided below the gate electrodes GE, respectively, and capping patterns CAP may be provided on the gate electrodes GE, respectively. Gate spacers GSP may be provided at both sides of each of the gate electrodes GE. In some example embodiments, the gate insulating pattern GI may be extended in between each gate electrode GE and the gate spacers GSP adjacent thereto.

Each of the gate electrodes GE may include a first gate electrode GE1 crossing the NMOSFET region NR and a second gate electrode GE2 crossing the PMOSFET region PR. The first gate electrode GE1 and the second gate electrode GE2 may be in contact with each other on the first device isolation layer ST1 to form an interface. The first gate electrode GE1 may have a work function different from that of the second gate electrode GE2. The gate insulating pattern GI may include a first gate insulating pattern GI1 and a second gate insulating pattern GI2 provided under the first and second gate electrodes GE1 and GE2, respectively. The first and second gate insulating patterns GI1 and GI2 may be continuously connected to each other to form a single body.

The gate electrodes GE may include at least one of doped semiconductors, metals, or conductive metal nitrides. As an example, in the case where the gate electrodes GE include a metal and a conductive metal nitride (e.g., tungsten (W) and titanium nitride (TiN)), a concentration of metal nitride in the second gate electrode GE2 may be higher than that of the first gate electrode GE1. The gate insulating pattern GI may include at least one of a silicon oxide layer, a silicon oxynitride layer, or high-k dielectrics, whose dielectric constants are higher than that of the silicon oxide layer. Each of the capping pattern CAP and the gate spacers GSP may include at least one of, for example, a silicon oxide layer, a silicon nitride layer, or a silicon oxynitride layer.

Source/drain regions SD may be provided in portions of the active patterns AP which are positioned at both sides of each of the gate electrodes GE. In some example embodiments, as shown in FIG. 3A, the source/drain regions SD may be epitaxial layers grown using the active patterns AP as a seed layer. In this case, the source/drain regions SD of the PMOSFET region PR may be configured to cause compressive strain, whereas the source/drain regions SD of the NMOSFET region NR may be configured to cause tensile strain. As an example, the source/drain regions SD of the PMOSFET region PR may include silicon germanium (SiGe), and the source/drain regions SD of the NMOSFET region NR may include silicon (Si) and/or silicon carbide (SiC). In some example embodiments, unlike that shown in FIG. 3A, the source/drain regions SD may be impurity regions formed in portions of the active fins AF positioned at both sides of each of the gate electrodes GE. In this case, the source/drain regions SD of the PMOSFET region PR may be p-type impurity regions, and the source/drain regions SD of the NMOSFET region NR may be n-type impurity regions.

The active patterns AP may include the upper portions (or the active fins AF), which are positioned below the gate electrodes GE and are overlapped by the gate electrodes GE, when viewed in a plan view. Such upper portions of the active pattern AP may serve as a channel region CH of a transistor.

A first interlayer insulating layer 110 may be provided on the substrate 100 to cover the gate electrodes GE and the source/drain regions SD. In some example embodiments, the first interlayer insulating layer 110 may be provided between the substrate 100 and the capping pattern CAP. The first interlayer insulating layer 110 may include at least one of a silicon oxide layer or a silicon oxynitride layer. Conductive patterns TS may be provided at both sides of each of the gate electrodes GE. The conductive patterns TS may penetrate the capping pattern CAP and the first interlayer insulating layer 110 and may be connected to the source/drain regions SD. On the PMOSFET region PR, each of the conductive patterns TS may be configured to connect the source/drain regions SD, which are spaced apart from each other in the second direction D2 with the third device isolation layer ST3/the first interlayer insulating layer 110 interposed therebetween, to each other. The conductive patterns TS may be in direct contact with the source/drain regions SD. The source/drain regions SD of the NMOSFET region NR may be connected to each other by the conductive patterns TS in the same manner. In other words, on the NMOSFET region NR, each of the conductive patterns TS may be configured to connect the source/drain regions SD, which are separated from each other in the second direction D2, to each other.

The conductive patterns TS may include at least one of metal silicides. For example, the conductive patterns TS may include at least one of titanium silicide, tantalum silicide, or tungsten silicide. The conductive patterns TS may further include at least one of metals. For example, the conductive patterns TS may further include at least one of titanium, tantalum, or tungsten. In some example embodiments, the conductive patterns TS may include a metal-silicide layer and a metal layer provided on the metal-silicide layer.

In some example embodiments, the conductive patterns TS may have top surfaces substantially coplanar with that of the capping pattern CAP.

A second interlayer insulating layer 120 may be provided on the capping pattern CAP. The second interlayer insulating layer 120 may include at least one of a silicon oxide layer or a silicon oxynitride layer.

Source/drain contacts CA may be provided at both sides of each of the gate electrodes GE. The source/drain contacts CA may penetrate the second interlayer insulating layer 120 and may be connected to the conductive patterns TS. The source/drain contacts CA may be electrically connected to the source/drain regions SD through the conductive patterns TS. A shape of the source/drain contacts CA may be variously changed. As an example, when viewed in a plan view, the source/drain contacts CA may be shaped like a bar extending in the second direction D2. In some embodiments, at least one of the source/drain contacts CA may be extended over the device isolation layer ST to connect the source/drain regions SD of the PMOSFET region PR with the source/drain regions SD of the NMOSFET region NR. The source/drain contacts CA may include at least one of, for example, doped semiconductors, metals, or conductive metal nitrides.

At least one gate contact CB may be provided on and electrically connected to each of the gate electrodes GE. The gate contact CB may penetrate the second interlayer insulating layer 120 and may be connected to a corresponding one of the gate electrodes GE.

The gate contact CB may include a body portion BP, which is in contact with an upper portion of a corresponding one of the gate electrodes GE, and extended portions EP, which are extended from the body portion BP toward the substrate 100 along both sidewalls of the corresponding one of the gate electrodes GE. The extended portions EP may be spaced apart from each other with the corresponding one of the gate electrodes GE interposed therebetween. The body portion BP and the extended portions EP may be continuously connected to form a single body. Each of the extended portions EP may have an inner sidewall EPi, which is positioned adjacent to the corresponding one of the gate electrodes GE, and an outer sidewall EPj, which is positioned opposite to the inner sidewall EPi. Both sidewalls BPs of the body portion BP may be respectively aligned with the outer sidewalls EPj of the extended portions EP. As shown in FIG. 3B, a height of a bottom surface L1 of the body portion BP may be lower than that of an uppermost top surface GE_U of the gate electrode GE.

In some example embodiments, the gate contact CB may be provided on the device isolation layer ST positioned between an adjacent pair of the active patterns AP. In this case, each of the extended portions EP may be extended from the body portion BP toward the device isolation layer ST along both sidewalls of a corresponding one of the gate electrodes GE. As an example, the gate contact CB may be provided on the first device isolation layer ST1 positioned between the PMOSFET and NMOSFET regions PR and NR. The gate contact CB may be positioned on the interface between the first and second gate electrodes GE1 and GE2 or on the first or second gate electrode GE1 or GE2. A height of a bottom surface L2 of each of the extended portions EP may be lower than that of the bottom surface L1 of the body portion BP. As shown in FIG. 3A, the height of the bottom surface L2 of each of the extended portions EP may be higher than that of a top surface ST_U of the device isolation layer ST. In addition, as shown in FIGS. 3A and 3B, the height of the bottom surface L2 of each of the extended portions EP may be lower than that of a top surface AP_U (i.e., the top surface of the active fin AF) of each of the active patterns AP.

The gate spacers GSP may be interposed between each of the gate electrodes GE and the extended portions EP. Furthermore, at least a portion of the first interlayer insulating layer 110 may also be interposed between each of the gate electrodes GE and the extended portions EP.

Top surfaces CA_U of the source/drain contacts CA may be positioned at substantially the same height as that of a top surface CB_U of the gate contact CB. The top surfaces CA_U of the source/drain contacts CA and the top surface CB_U of the gate contact CB may be substantially coplanar with the top surface of the second interlayer insulating layer 120.

The source/drain contacts CA and the gate contact CB may be formed of or include the same material. The gate contact CB may include at least one of doped semiconductors, metals, or conductive metal nitrides.

Interconnection lines may be provided on the substrate 100 and may be electrically connected to the source/drain contacts CA and the gate contact CB. The interconnection lines may be respectively connected to the source/drain contacts CA and the gate contact CB, and thus, voltages transmitted from the outside (e.g., from external to the cell) may be applied to the source/drain regions SD and the gate electrodes GE through the interconnection lines.

According to some example embodiments of present inventive concepts, such as is illustrated in FIG. 3B, the bottom surface L1 of the body portion BP of the gate contact CB may be lower than the top surface GE_U of the gate electrode GE, and thus, at least a portion of the body portion BP of the gate contact CB may be inserted/embedded into the gate electrode GE. This may lead to an increase in a contact area between the gate contact CB and the gate electrode GE and consequently a reduction in electrical resistance between the gate contact CB and the gate electrode GE. Accordingly, it may be possible to improve a resistance property of a semiconductor device.

FIGS. 4A, 5A, 6A, 7A, 8A, and 9A are sectional views corresponding to line I-I' of FIG. 2 to illustrate a method of fabricating a semiconductor device, according to some example embodiments of present inventive concepts. FIGS. 4B, 5B, 6B, 7B, 8B, and 9B are sectional views corresponding to line II-II' of FIG. 2 to illustrate the method of fabricating a semiconductor device, according to some example embodiments of present inventive concepts. FIGS. 4C, 5C, 6C, 7C, 8C, and 9C are sectional views corresponding to line III-III' of FIG. 2 to illustrate the method of fabricating a semiconductor device, according to some example embodiments of present inventive concepts.

Referring to FIGS. 2, 4A, 4B, and 4C, the first device isolation layer ST1 and the second device isolation layer ST2 may be formed on a substrate 100. In example embodiments, the substrate 100 may be, for example, a silicon wafer, a germanium wafer, or a silicon-on-insulator (SOI) wafer. The first device isolation layer ST1 may be formed to extend in the first direction D1 and separate the PMOSFET region PR of the first logic cell C1 from the NMOSFET region NR of the first logic cell C1. The second device isolation layer ST2 may be formed to extend in the first direction D1 and separate the first logic cell C1 from other cells adjacent thereto. Hereinafter, a depth of a pattern or layer may refer to a vertical length thereof, which is measured along a direction from a top surface of the substrate 100 to a bottom surface of the substrate 100. In some embodiments, the depth of the second device isolation layer ST2 may be greater than that of the first device isolation layer ST1, unlike that illustrated in the drawings. The first and second device isolation layers ST1 and ST2 may be formed by a shallow trench isolation (STI) process.

The third device isolation layer ST3 may be formed on the substrate 100. The third device isolation layer ST3 may be formed to extend in the first direction D1 and define the active patterns AP in the PMOSFET and NMOSFET regions PR and NR. As an example, each of the active patterns AP may include the upper portion (i.e., the active fin AF) exposed by the third device isolation layer ST3. The third device isolation layer ST3 may be formed by a shallow trench isolation (STI) process. In some example embodiments, the depth of the third device isolation layer ST3 may be smaller (e.g., shallower) than the respective depths of the first and second device isolation layers ST1 and ST2. Alternatively, the first to third device isolation layers ST1, ST2, and ST3 may be formed using the same process, and in this case, they may have substantially the same depth. The first to third device isolation layers ST1, ST2, and ST3 may be formed of or include a silicon oxide layer.

Sacrificial gate patterns 102 may be formed on the substrate 100 to cross the active patterns AP and extend in the second direction D2. The sacrificial gate patterns 102 may extend parallel to the second direction D2 to cross the PMOSFET and NMOSFET regions PR and NR. The sacrificial gate patterns 102 may be arranged spaced apart from each other in the first direction D1. The sacrificial gate pattern 102 may be formed of or include, for example, poly silicon. In example embodiments, the formation of the sacrificial gate pattern 102 may include sequentially forming an etch stop layer and a sacrificial gate layer on the substrate 100 to cover the active patterns AP, forming a sacrificial mask pattern on the sacrificial gate layer, and patterning the sacrificial gate layer and the etch stop layer using the sacrificial mask pattern as an etch mask. As a result, etch stop patterns may be formed below the sacrificial gate patterns 102, respectively.

Gate spacers GSP may be formed on both sidewalls of the sacrificial gate pattern 102. The gate spacers GSP may be formed by forming a spacer layer to cover the sacrificial gate pattern 102 and anisotropically etching the spacer layer. The spacer layer may include at least one of a silicon oxide layer, a silicon nitride layer, or a silicon oxynitride layer.

Figure 4A:
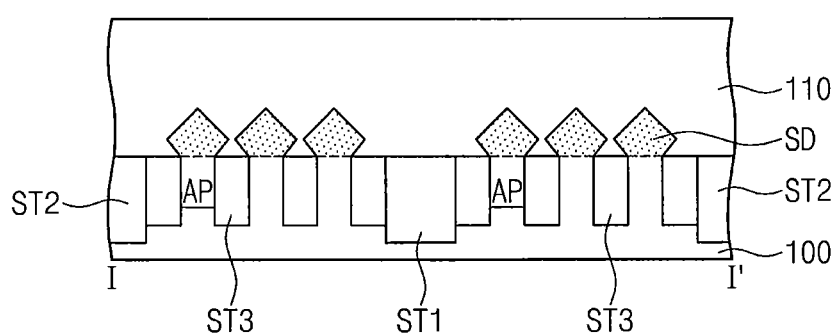
FIGS. 4A, 5A, 6A, 7A, 8A, and 9A are sectional views corresponding to line I-I' of FIG. 2 to illustrate a method of fabricating a semiconductor device, according to some example embodiments of present inventive concepts.
Figure 4B:
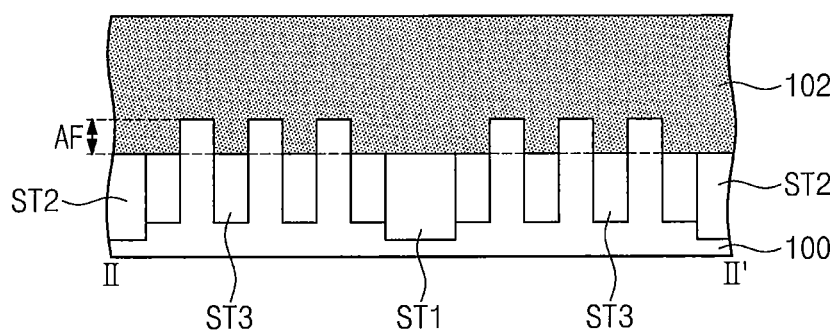
FIGS. 4B, 5B, 6B, 7B, 8B, and 9B are sectional views corresponding to line II-II' of FIG. 2 to illustrate the method of fabricating a semiconductor device, according to some example embodiments of present inventive concepts.
Figure 4C:
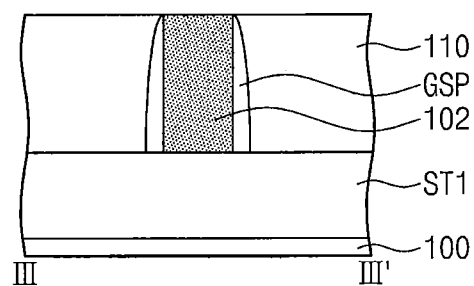
FIGS. 4C, 5C, 6C, 7C, 8C, and 9C are sectional views corresponding to line III-III' of FIG. 2 to illustrate the method of fabricating a semiconductor device, according to some example embodiments of present inventive concepts.
Figure 5A:
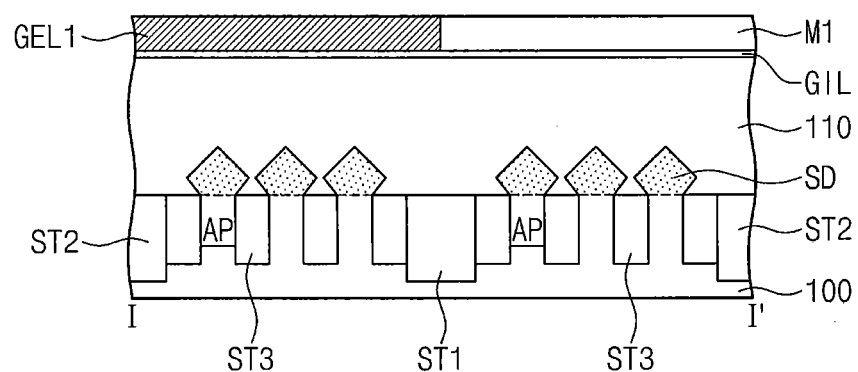
Figure 5B:
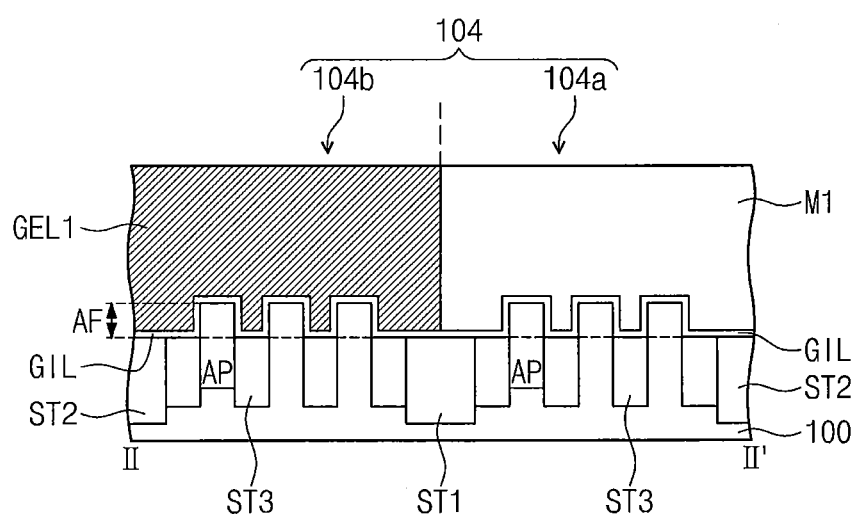
Figure 5C:
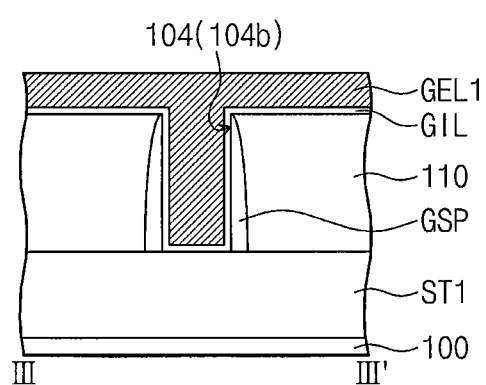
Figure 6A:
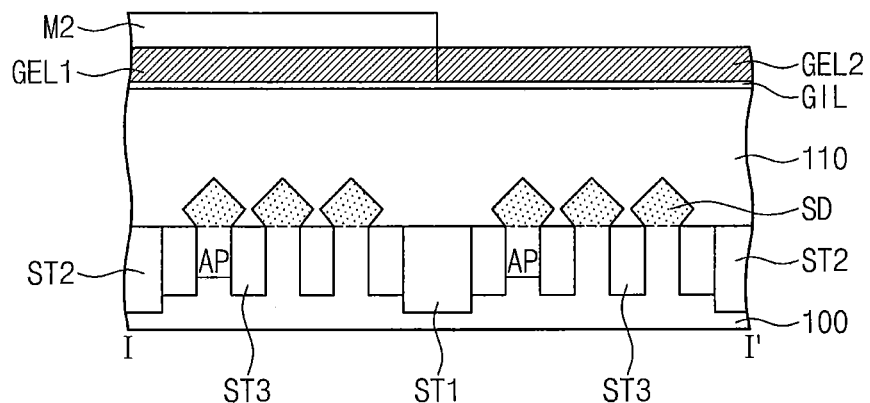
Figure 6B:
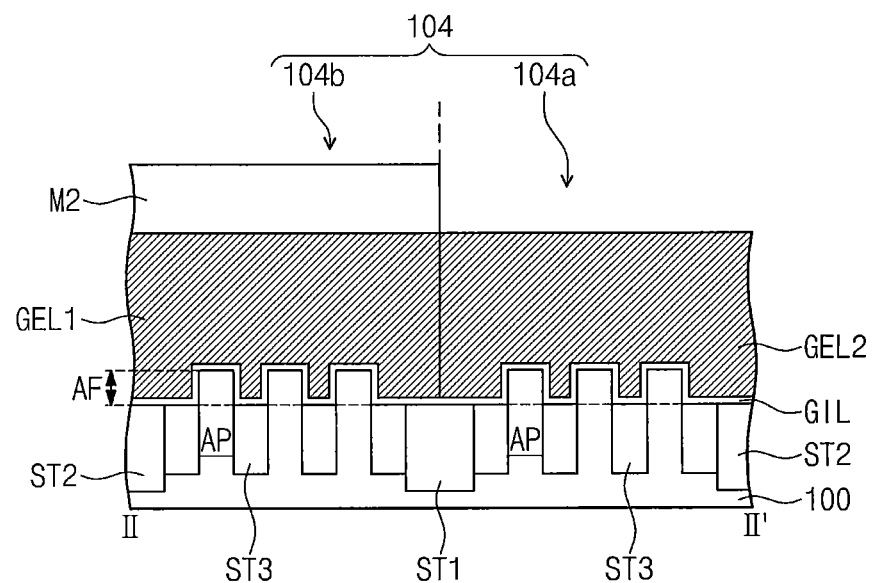
Figure 6C:
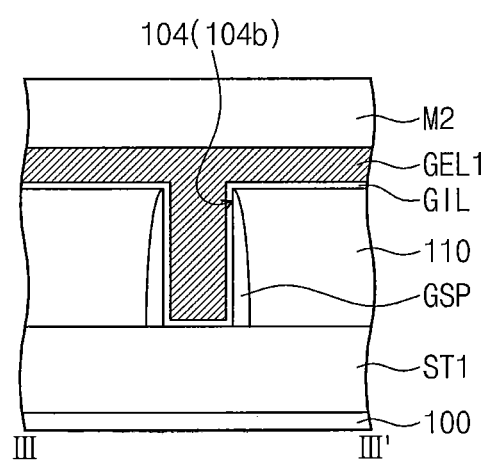

The source/drain regions SD may be formed on the active patterns AP at both sides of the sacrificial gate pattern 102. For example, as shown in FIG. 4A, the formation of the source/drain regions SD may include partially removing upper portions of the active patterns AP or the active fins AF at both sides of the sacrificial gate pattern 102 and performing a selective epitaxial growth process using the active patterns AP, whose upper portions are removed, as a seed layer. In this case, the source/drain regions SD of the PMOSFET region PR may be formed to cause compressive strain, whereas the source/drain regions SD of the NMOSFET region NR may be formed to cause tensile strain. As an example, the source/drain regions SD of the PMOSFET region PR may be formed of silicon germanium (SiGe), and the source/drain regions SD of the NMOSFET region NR may be formed of silicon carbide (SiC). Alternatively, unlike that shown in FIG. 4A, the formation of the source/drain regions SD may include performing an ion implantation process to inject dopants into the upper portions of the active patterns AP or the active fins AF at both sides of the sacrificial gate pattern 102. The ion implantation process may be performed in such a way that the source/drain regions SD of p-type are formed in the PMOSFET region PR and the source/drain regions SD of n-type are formed in the NMOSFET region NR.

The source/drain regions SD may not be formed in portions of the active patterns AP or the active fins AF that are positioned below the sacrificial gate pattern 102 and are overlapped by the sacrificial gate pattern 102 in a plan view.

The first interlayer insulating layer 110 may be formed on the substrate 100 to cover the sacrificial gate pattern 102. The first interlayer insulating layer 110 may include at least one of a silicon oxide layer or a silicon oxynitride layer. A planarization process may be performed on the first interlayer insulating layer 110 to expose the top surface of the sacrificial gate pattern 102.

Referring to FIGS. 2, 5A, 5B, and 5C, the sacrificial gate pattern 102 may be removed to form a gap region 104 between the gate spacers GSP. The gap region 104 may be formed to expose the substrate 100. In example embodiments, the gap region 104 may include a first region 104a exposing the PMOSFET region PR of the substrate 100 and a second region 104b exposing the NMOSFET region NR of the substrate 100. The formation of the gap region 104 may include performing an etching process, which is configured to have an etch selectivity with respect to the first interlayer insulating layer 110, the gate spacers GSP, and the etch stop pattern, to remove the sacrificial gate pattern 102, and then, performing another etching process, which is configured to have an etch selectivity with respect to the first interlayer insulating layer 110, the gate spacers GSP, and the substrate 100, to remove the etch stop pattern. Thereafter, a gate insulating layer GIL may be formed on the first interlayer insulating layer 110 to partially fill the gap region 104.

A first mask pattern M1 may be formed on the gate insulating layer GIL to fill the first region 104a of the gap region 104. The first mask pattern M1 may be formed on the PMOSFET region PR. The first mask pattern M1 may include at least one of, for example, spin-on-hardmask (SOH) materials.

After the formation of the first mask pattern M1, a first gate electrode layer GEL1 may be formed on the gate insulating layer GIL to fill the remaining space of the second region 104b.

Referring to FIGS. 2, 6A, 6B, and 6C, the first mask pattern M1 may be removed. For example, the first mask pattern M1 may be removed by ashing and/or strip processes. Thereafter, a second mask pattern M2 may be formed on the substrate 100 to cover the first gate electrode layer GEL1. The second mask pattern M2 may be formed on the NMOSFET region NR. The second mask pattern M2 may be formed to expose the gate insulating layer GIL on the PMOSFET region PR and the first region 104a of the gap region 104. The second mask pattern M2 may include at least one of, for example, spin-on-hardmask (SOH) materials.

After the formation of the second mask pattern M2, a second gate electrode layer GEL2 may be formed on the gate insulating layer GIL to fill the remaining space of the first region 104a.

The second gate electrode layer GEL2 may be formed to have a work function different from that of the first gate electrode layer GEL1. For example, each of the first gate electrode layer GEL1 and the second gate electrode layer GEL2 may include a metal and a conductive metal nitride (e.g., W and TiN), and in this case, the second gate electrode layer GEL2 may be formed in such a way that a concentration of metal nitride thereof is higher than that of the first gate electrode layer GEL1. The first gate electrode layer GEL1 and the second gate electrode layer GEL2 may be formed to be in contact with each other on the first device isolation layer ST1, thereby forming an interface on the first device isolation layer ST1.

Referring to FIGS. 2, 7A, 7B, and 7C, the second mask pattern M2 may be removed. For example, the second mask pattern M2 may be removed by ashing and/or strip processes.

Thereafter, a planarization process may be performed on the first and second gate electrode layers GEL1 and GEL2 and the gate insulating layer GIL to expose the top surface of the first interlayer insulating layer 110. As a result of the planarization process, top surfaces of the gate spacers GSP may also be exposed. The planarization process may be performed until the first and second gate electrode layers GEL1 and GEL2 have a desired thickness in the gap region 104. As a result, the first gate electrode GE1 may be formed to cross the NMOSFET region NR, and the second gate electrode GE2 may be formed to cross the PMOSFET region PR. In addition, as a result of the planarization process, the first gate insulating pattern GI1 may be formed under the first gate electrode GE1 and the second gate insulating pattern GI2 may be formed under the second gate electrode GE2. The first gate insulating pattern GI1 may extend in between the first gate electrode GE1 and the gate spacers GSP, and the second gate insulating pattern GI2 may extend in between the second gate electrode GE2 and the gate spacers GSP. The first and second gate insulating patterns GI1 and GI2 may be continuously connected to each other to form a single body.

The planarization process may be performed in such a way that the first gate electrode GE1 and the first gate insulating pattern GI1 have top surfaces coplanar with each other and that the second gate electrode GE2 and the second gate insulating pattern GI2 have top surfaces substantially coplanar with each other. Furthermore, the planarization process may be performed in such a way that the first and second gate electrodes GE1 and GE2 and the first and second gate insulating patterns GI1 and GI2 have top surfaces substantially coplanar with that of the first interlayer insulating layer 110.

Thereafter, the capping pattern CAP may be formed on the first interlayer insulating layer 110. The capping pattern CAP may be formed to cover the top surfaces of the first and second gate electrodes GE1 and GE2, the top surfaces of the first and second gate insulating patterns GI1 and GI2, and the top surfaces of the gate spacers GSP and may be extended to cover the top surface of the first interlayer insulating layer 110.

The first and second gate insulating patterns GI1 and GI2 may constitute the gate insulating pattern GI, and the first and second gate electrodes GE1 and GE2 may constitute the gate electrode GE. The gate spacers GSP may be provided on both sidewalls of the gate electrode GE, and the capping pattern CAP may be provided on the top surface of the gate electrode GE.

Figure 7A:
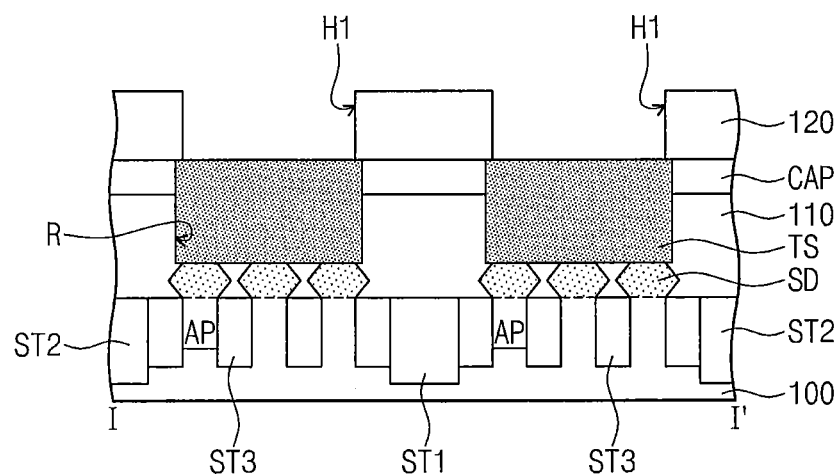
Figure 7B:
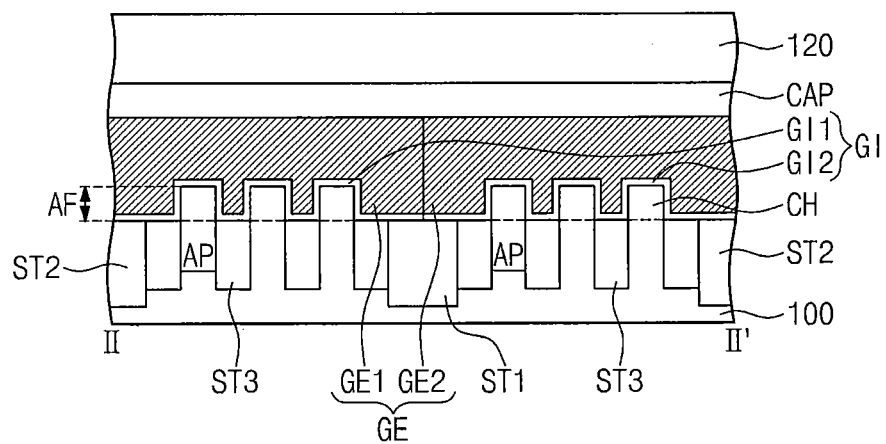
Figure 7C:
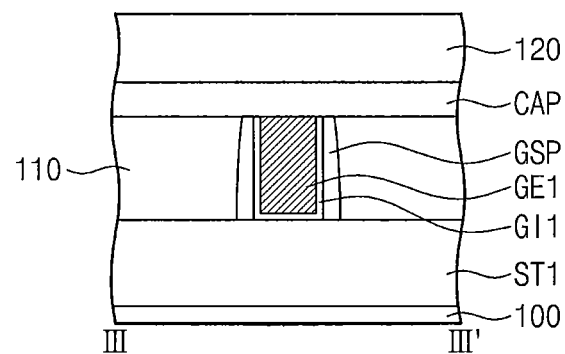

The conductive patterns TS may be formed to penetrate the capping pattern CAP and the first interlayer insulating layer 110 at both sides of the gate electrode GE and may be connected to the source/drain regions SD. The formation of the conductive patterns TS may include forming recess regions R to penetrate the capping pattern CAP and the first interlayer insulating layer 110 and expose the source/drain regions SD at both sides of the gate electrode GE, forming a conductive layer on the capping pattern CAP to fill the recess regions R, and planarizing the conductive layer to expose the capping pattern CAP. In example embodiments, as shown in FIG. 7A, upper portions of the source/drain regions SD may be removed, during the etching process for forming the recess regions R.

The conductive patterns TS may be formed of or include at least one of metal silicides. For example, the conductive patterns TS may include at least one of titanium silicide, tantalum silicide, or tungsten silicide. The conductive patterns TS may further include at least one of metals. For example, the conductive patterns TS may further include at least one of titanium, tantalum, or tungsten. In example embodiments, the conductive patterns TS may include a metal-silicide layer and a metal layer provided on the metal-silicide layer.

On the PMOSFET region PR, each of the conductive patterns TS may be formed to connect the source/drain regions SD, which are spaced apart from each other in the second direction D2 by the third device isolation layer ST3 interposed therebetween, to each other. On the NMOSFET region NR, each of the conductive patterns TS may be formed to connect the source/drain regions SD, which are spaced apart from each other in the second direction D2 by the third device isolation layer ST3 interposed therebetween, to each other.

The second interlayer insulating layer 120 may be formed on the structure provided with the conductive patterns TS. The second interlayer insulating layer 120 may include a silicon oxide layer or a silicon oxynitride layer.

The second interlayer insulating layer 120 may be patterned to form source/drain contact holes H1 exposing the conductive patterns TS, at both sides of the gate electrode GE. Each of the source/drain contact holes H1 may be formed to extend along a top surface of each of the conductive patterns TS. For example, each of the source/drain contact holes H1 may extend in the second direction D2. In some embodiments, at least one of the source/drain contact holes H1 may extend to a region on the device isolation layer ST and may expose the conductive patterns TS on the PMOSFET and NMOSFET regions PR and NR.

Referring to FIGS. 2, 8A, 8B, and 8C, a mask layer M3 may be formed on the second interlayer insulating layer 120 to fill the source/drain contact holes H1. The mask layer M3 may be formed of or include at least one of, for example, spin-on-hardmask (SOH) materials.

The mask layer M3 and the second interlayer insulating layer 120 may be patterned to form a gate contact hole H2 exposing the top surface of the gate electrode GE. The gate contact hole H2 may be formed spaced apart from the source/drain contact holes H1.

The gate contact hole H2 may include a body hole BH exposing the gate electrode GE and extended holes EH extending from the body hole BH toward the substrate 100 along both sidewalls of the gate electrode GE. The body hole BH and the extended holes EH may be connected to each other.

Figure 8A:
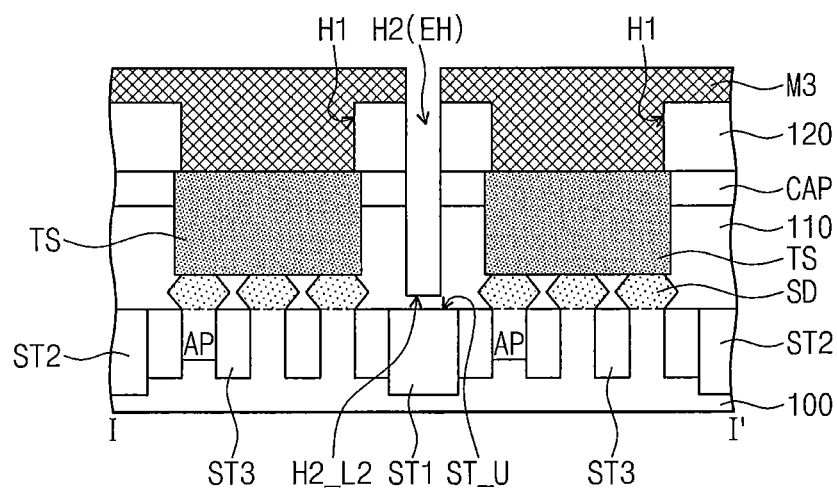
Figure 8B:
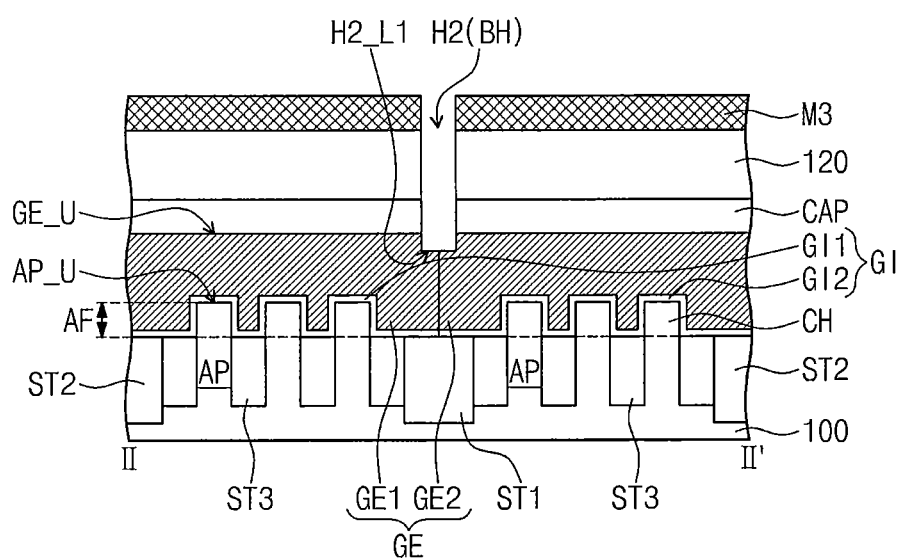
Figure 8C:
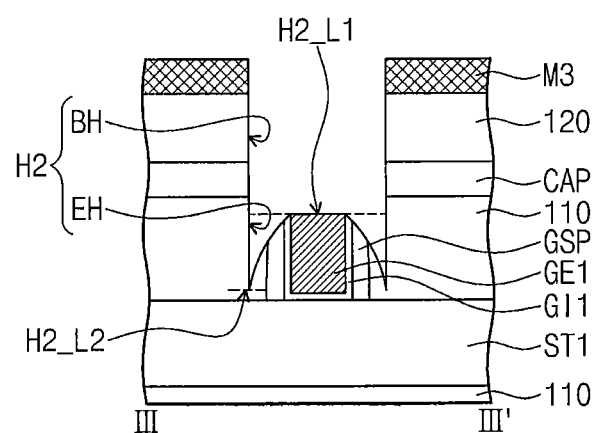
Figure 9A:
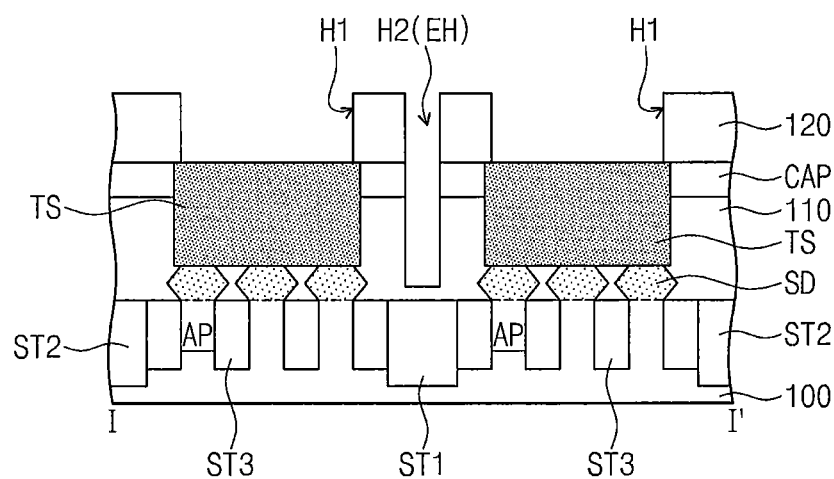
Figure 9B:
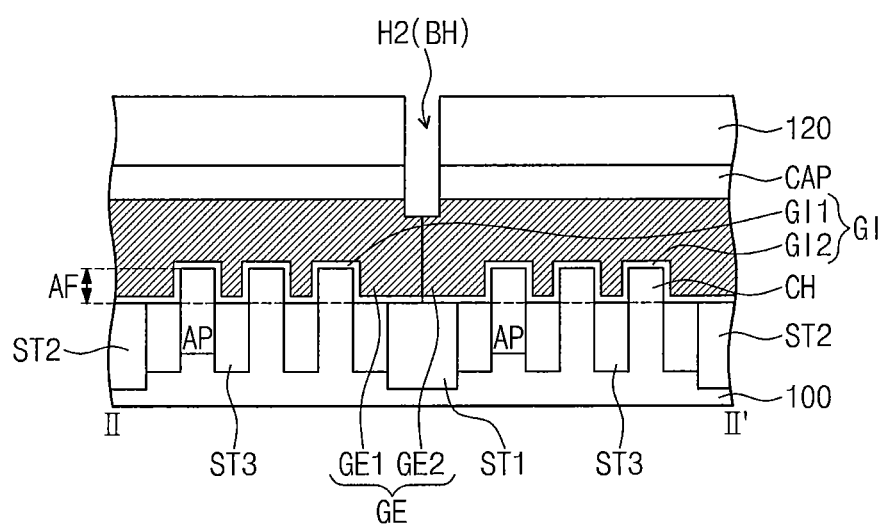
Figure 9C:
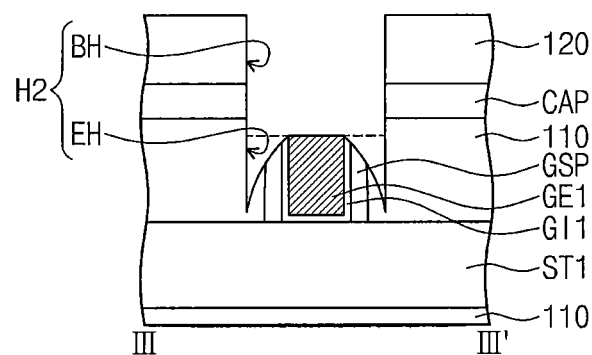

The formation of the gate contact hole H2 may include performing an etching process having an etch selectivity with respect to the gate electrode GE to pattern the mask layer M3, the second interlayer insulating layer 120, and the capping pattern CAP. During the etching process, an upper portion of the gate electrode GE may be over-etched, and in this case, a bottom surface H2_L1 of the body hole BH may be formed at a lower level than that of the top surface GE_U of the gate electrode GE. In addition, during the etching process, the first interlayer insulating layer 110 may be over-etched at both sides of the gate electrode GE. In the case where the etching process is performed using an etching condition having an etch selectivity with respect to the gate electrode GE, an etch rate of the first interlayer insulating layer 110 may be higher than that of the gate electrode GE, during the etching process. Accordingly, as shown in FIG. 8C, the extended holes may be formed to have a bottom surface H2_L2 positioned lower than the bottom surface H2_L1 of the body hole BH. In example embodiments, a level or height of the bottom surface H2_L2 of the extended hole EH may be higher than that of the top surface ST_U of the device isolation layer ST and may be lower than that of the top surface AP_U of the active pattern AP or the active fin AF.

The extended holes EH may be spaced apart from the gate electrode GE by the gate spacers GSP interposed therebetween. At least a portion of the first interlayer insulating layer 110 may be interposed between the extended holes EH and the gate electrode GE.

According to some example embodiments of present inventive concepts, during the etching process for forming the gate contact hole H2, the etch rate of the first interlayer insulating layer 110 may be faster than that of the gate electrode GE. In the case where the gate electrode GE is over-etched in the etching process, the body hole BH may be formed to have the bottom surface H2_L1 lower than the top surface GE_U of the gate electrode GE. In other words, the over-etching process may be performed to increase an exposed area of the gate electrode GE, and it may thus be possible to increase a contact area between the gate contact, which will be formed in a subsequent process, and the gate electrode GE.

Furthermore, the use of the over-etching process may make it possible to control the height of the bottom surface H2_L2 of the extended holes EH in such a way that the bottom surface H2_L2 is positioned at a level lower than the bottom surface H2_L1 of the body hole BH and higher than the top surface ST_U of the device isolation layer ST. Accordingly, it may be possible to relatively easily fabricate a semiconductor device, in which a contact area between the gate contact and the gate electrode GE is increased.

In other words, as a result of the over-etching process, it may be possible to relatively easily realize/produce a semiconductor device having low electrical resistance between the gate contact and the gate electrode.

Referring to FIGS. 2, 9A, 9B, and 9C, the mask layer M3 may be removed. For example, the mask layer M3 may be removed by ashing and/or strip processes.

Referring back to FIGS. 2, 3A, 3B, and 3C, a conductive layer may be formed on the second interlayer insulating layer 120 to fill the source/drain contact holes H1 and the gate contact hole H2. The conductive layer may be formed of or include at least one of, for example, doped semiconductors, metals, or conductive metal nitrides. A planarization process may be performed on the conductive layer to expose the second interlayer insulating layer 120 and thereby form the source/drain contacts CA and the gate contact CB in the source/drain contact holes H1 and the gate contact hole H2, respectively. As a result of the planarization process, the source/drain contacts CA and the gate contact CB may have the top surfaces CA_U and the top surface CB_U, which are positioned at substantially the same height. The top surfaces CA_U of the source/drain contacts CA and the top surface CB_U of the gate contact CB may be substantially coplanar with the top surface of the second interlayer insulating layer 120.

The interconnection lines may be formed on the substrate 100 and may be electrically connected to the source/drain contacts CA and the gate contact CB. The interconnection lines may be respectively connected to the source/drain regions SD and the gate electrodes GE through the source/drain contacts CA and the gate contact CB, and thus, voltages transmitted from the outside (e.g., from external to the cell) may be applied to the source/drain regions SD and the gate electrodes GE through the interconnection lines.

Figure 26:
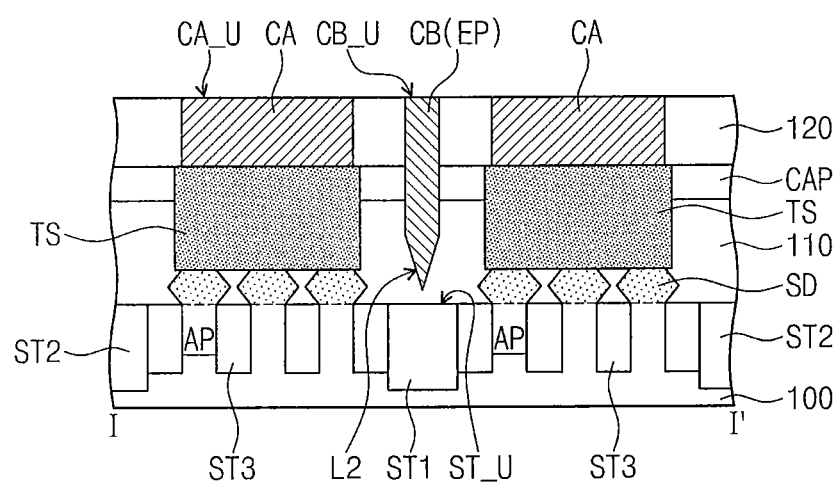
FIG. 26 is a sectional view taken along line I-I' of FIG. 2 according to some example embodiments of present inventive concepts.

FIG. 26 is a sectional view taken along line I-I' of FIG. 2 according to some embodiments. For concise description, an element previously described with reference to FIGS. 2, 3A, 3B, and 3C may be identified by a similar or identical reference number without repeating a duplicative description thereof.

In some embodiments according to FIG. 26, each of the extended portions EP of the gate contact CB may have an end portion tapered toward the device isolation layer ST. For example, each of the extended portions EP may be provided in such a way that the end portion thereof has a pointed structure substantially tapered toward the device isolation layer ST. For example, referring to FIG. 8A, the extended holes EH of the gate contact hole H2 may be formed to have a lower region tapered toward the device isolation layer ST, which is in contrast with the flat lower region of the extended hole EH that is shown in FIG. 8A.

Figure 10:
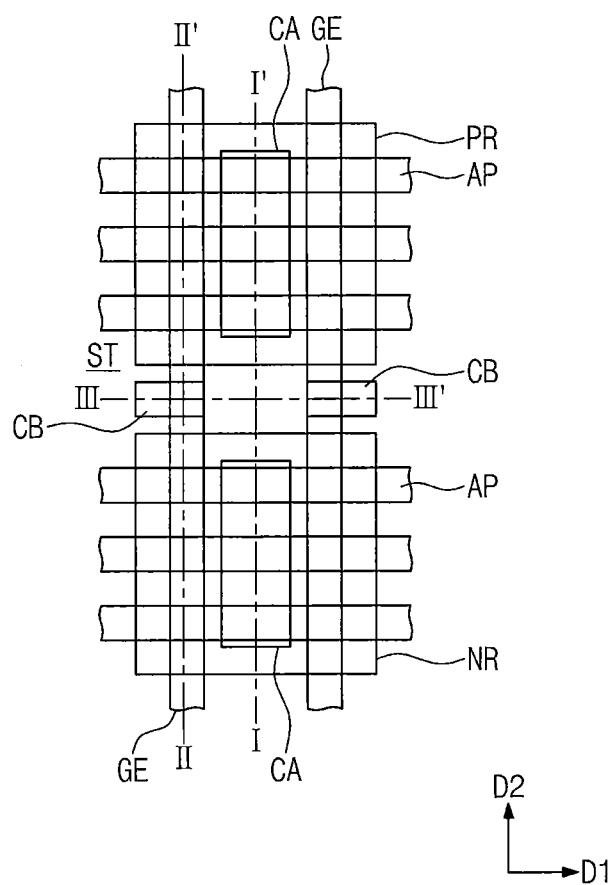
FIG. 10 is a plan view illustrating a portion (e.g., corresponding to the first logic cell C1 of FIG. 1) of a semiconductor device according to some example embodiments of present inventive concepts.
Figure 11A:
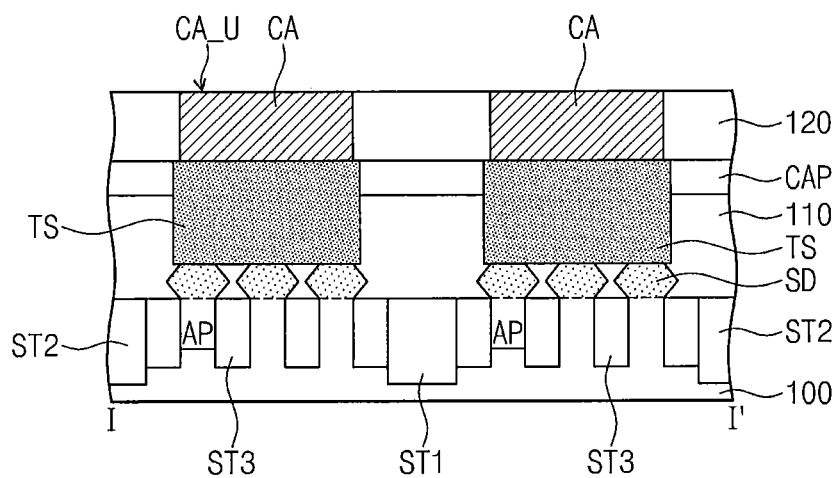
FIGS. 11A, 11B, and 11C are sectional views taken along lines I-I', II-II', and III-III', respectively, of FIG. 10.
Figure 11B:
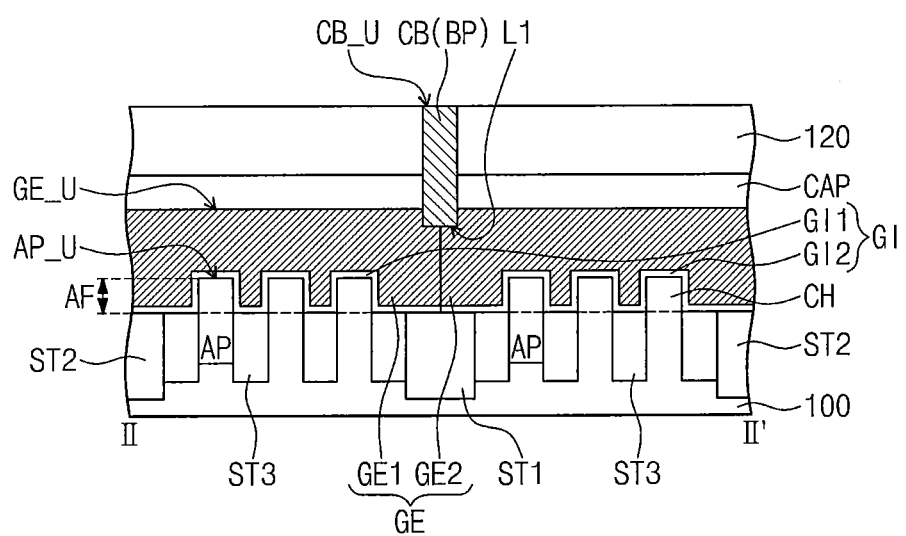
Figure 11C:
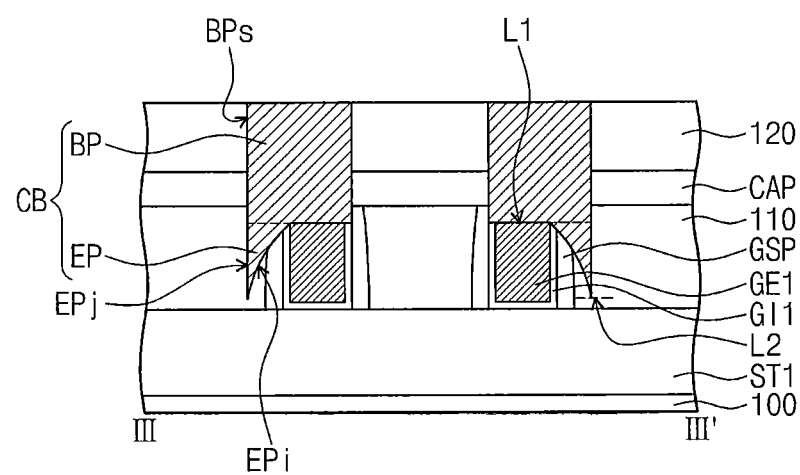
Figure 12:
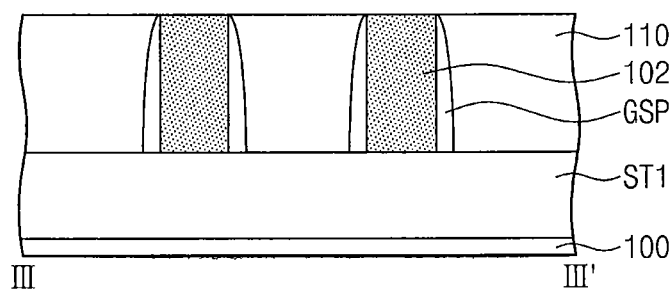
FIGS. 12 through 15, FIGS. 16A through 16C, and FIGS. 17A through 17C are sectional views illustrating a method of fabricating a semiconductor device according to some example embodiments of present inventive concepts.
Figure 13:
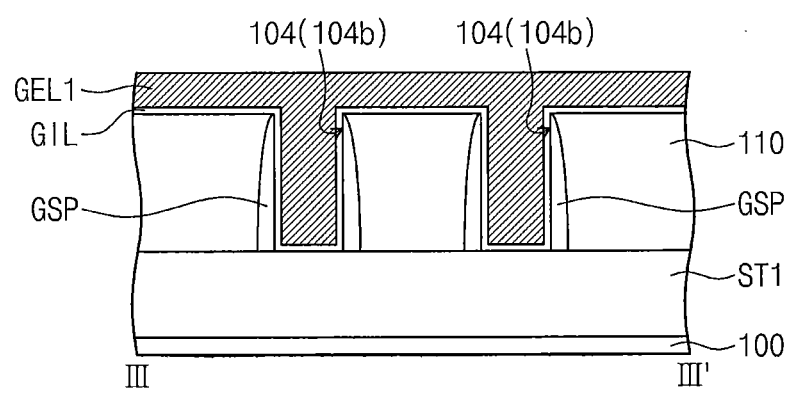
Figure 14:
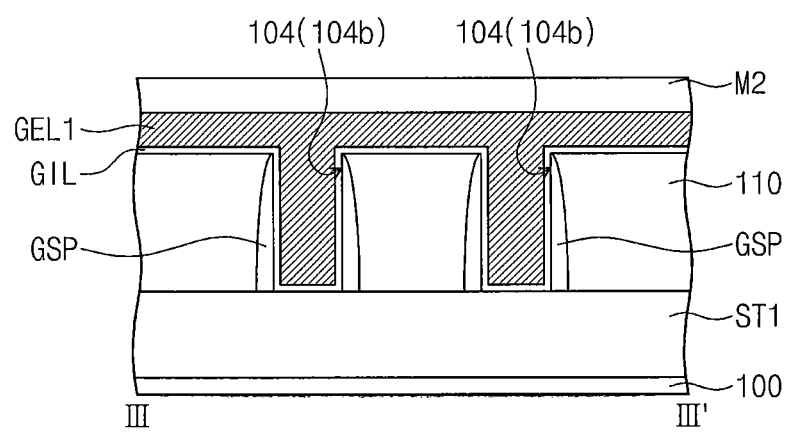
Figure 15:
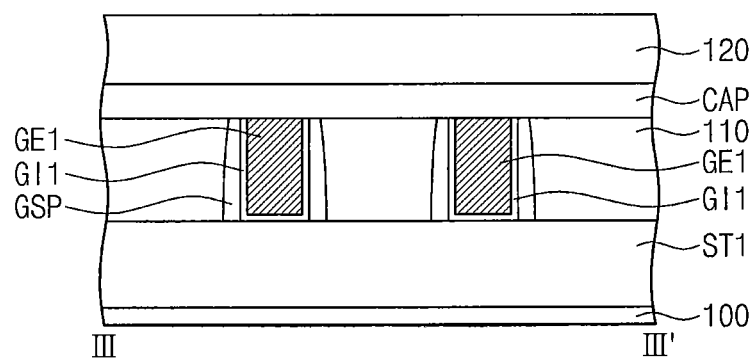

FIG. 10 is a plan view illustrating a portion (e.g., corresponding to the first logic cell C1 of FIG. 1) of a semiconductor device according to some example embodiments of present inventive concepts. FIGS. 11A, 11B, and 11C are sectional views taken along lines I-I', II-II', and III-III', respectively, of FIG. 10. For concise description, an element previously described with reference to FIGS. 2, 3A, 3B, and 3C may be identified by a similar or identical reference number without repeating a duplicative description thereof.

Referring to FIGS. 1, 10, 11A, 11B, and 11C, at least one gate contact CB may be provided on and electrically connected to each of the gate electrodes GE. The gate contact CB may penetrate the second interlayer insulating layer 120 and may be connected to a corresponding one of the gate electrodes GE.

According to some embodiments, the gate contact CB may include a body portion BP, which is in contact with an upper portion of a corresponding one of the gate electrodes GE, and an extended portion EP, which extends from the body portion BP toward the substrate 100 along one of the sidewalls of the gate electrodes GE. The extended portion EP may be provided adjacent to one of the sidewalls BPs of the body portion BP. The body portion BP and the extended portion EP may be continuously connected to form a single body. The extended portion EP may have the inner sidewall EPi, which is positioned adjacent to the corresponding one of the gate electrodes GE, and the outer sidewall EPj, which is positioned opposite to the inner sidewall EPi. One of the sidewalls BPs of the body portion BP may be aligned to the outer sidewall EPj of the extended portion EP. As shown in FIG. 11B, a height of a bottom surface L1 of the body portion BP may be lower than that of the uppermost top surface GE_U of the gate electrode GE.

In some example embodiments, the gate contact CB may be provided on the device isolation layer ST positioned between an adjacent pair of the active patterns AP. In this case, the extended portion EP may extend from the body portion BP toward the device isolation layer ST along the sidewall of each of the gate electrodes GE. As an example, the gate contact CB may be provided on the first device isolation layer ST1 positioned between the PMOSFET and NMOSFET regions PR and NR. The gate contact CB may be positioned on the interface between the first and second gate electrodes GE1 and GE2 provided on the NMOSFET and PMOSFET regions NR and PR, respectively, or on the first or second gate electrode GE1 or GE2. As described with reference to FIG. 3A, the height of the bottom surface L2 of the extended portion EP may be higher than that of the top surface ST_U of the device isolation layer ST. In addition, as shown in FIGS. 3A and 11B/11C, the height of the bottom surface L2 of the extended portion EP may be lower than that of a top surface AP_U (i.e., the top surface of the active fin AF) of each of the active patterns AP.

The gate spacer GSP may be interposed between the sidewall of each of the gate electrodes GE and the extended portion EP. Furthermore, at least a portion of the first interlayer insulating layer 110 may also be interposed between the sidewall of each of the gate electrodes GE and the extended portion EP.

The top surfaces CA_U of the source/drain contacts CA may be positioned at substantially the same height as that of the top surface CB_U of the gate contact CB. The top surfaces CA_U of the source/drain contacts CA and the top surface CB_U of the gate contact CB may be substantially coplanar with the top surface of the second interlayer insulating layer 120.

The source/drain contacts CA and the gate contact CB may be formed of or include the same material. The gate contact CB may include at least one of doped semiconductors, metals, or conductive metal nitrides.

Figure 16A:
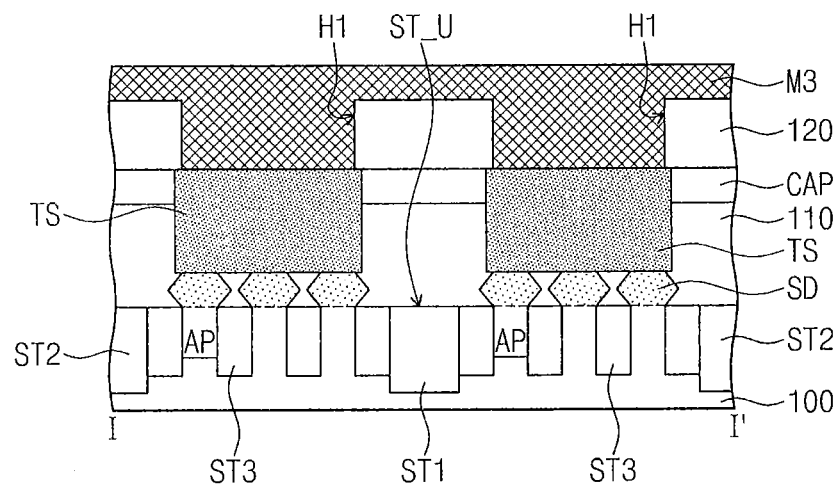
Figure 16B:
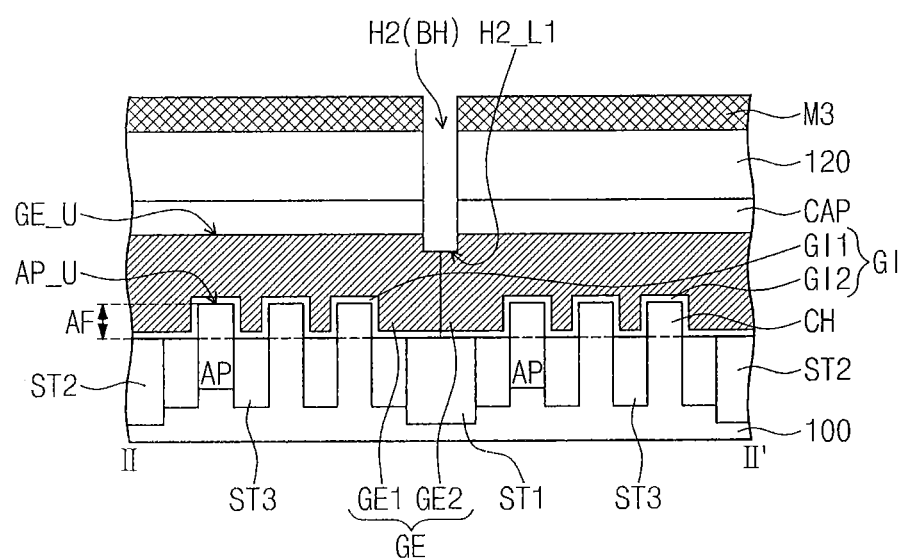
Figure 16C:
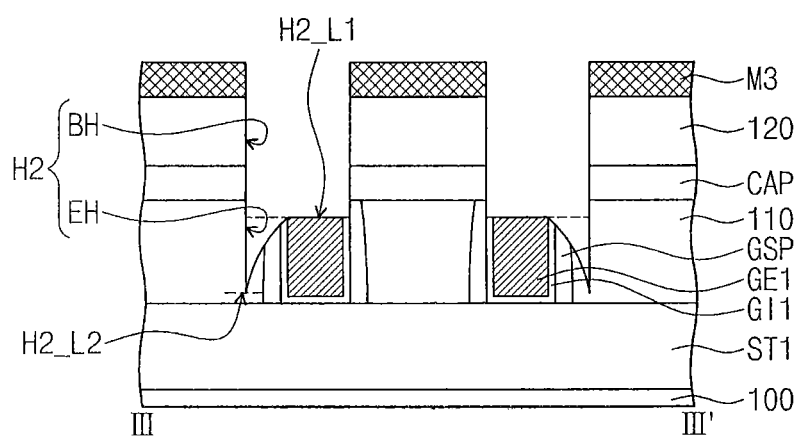
Figure 17A:
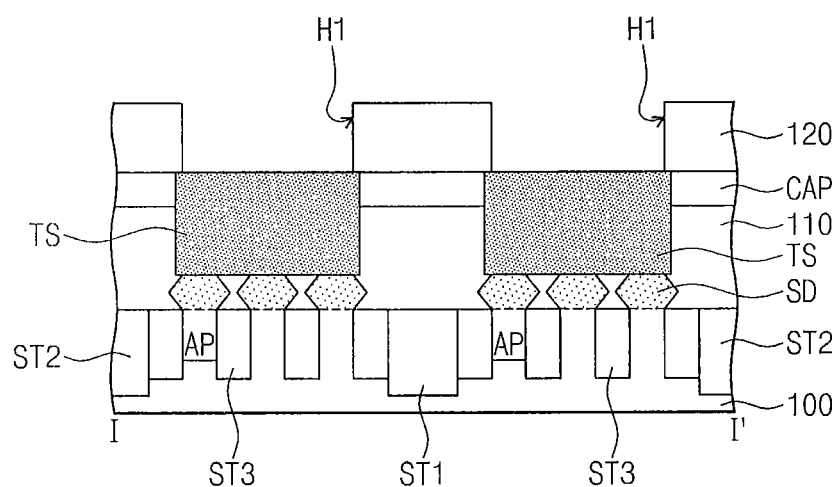
Figure 17B:
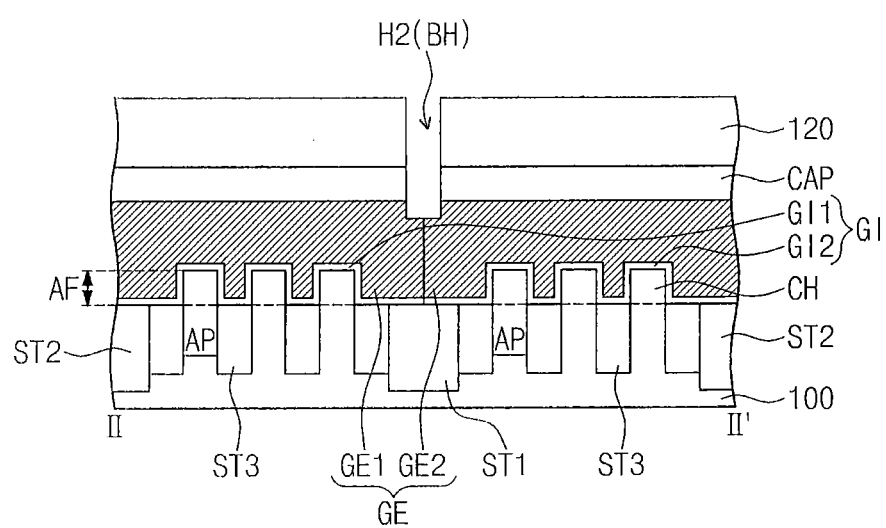
Figure 17C:
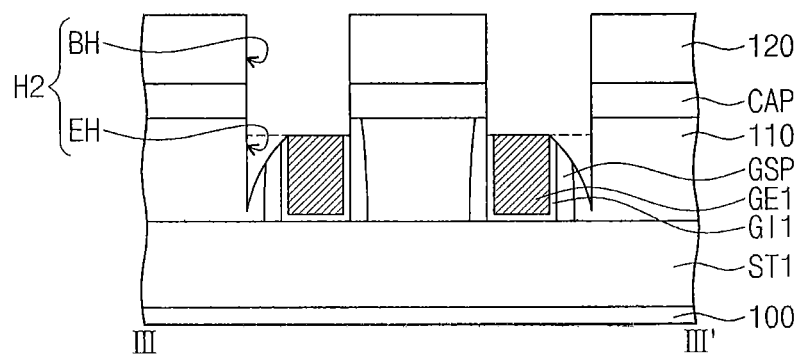

FIGS. 12 through 15, FIGS. 16A through 16C, and FIGS. 17A through 17C are sectional views illustrating a method of fabricating a semiconductor device according to some example embodiments of present inventive concepts. In detail, FIGS. 16A and 17A are sectional views corresponding to line I-I' of FIG. 10, and FIGS. 16B and 17B are sectional views corresponding to line II-II' of FIG. 10. FIGS. 12 through 15, 16C, and 17C are sectional views corresponding to line III-III' of FIG. 10. For concise description, an element or step previously described with reference to FIGS. 4A-9C may be identified by a similar or identical reference number without repeating a duplicative description thereof.

Referring to FIGS. 10, 4A, 4B, and 12, the first device isolation layer ST1 and the second device isolation layer ST2 may be formed on a substrate 100. The first device isolation layer ST1 may be formed to extend in the first direction D1 and separate the PMOSFET and NMOSFET regions PR and NR of the first logic cell C1 from each other. The second device isolation layer ST2 may be formed to extend in the first direction D1 and separate the first logic cell C1 from other logic cells adjacent thereto. The third device isolation layer ST3 may be formed on the substrate 100. The third device isolation layer ST3 may be formed to extend in the first direction D1 and define the active patterns AP in the PMOSFET and NMOSFET regions PR and NR. As an example, each of the active patterns AP may include the upper portion (i.e., the active fin AF) exposed by the third device isolation layer ST3.

The sacrificial gate patterns 102 may be formed on the substrate 100 to cross the active patterns AP and extend in the second direction D2. The sacrificial gate patterns 102 may extend parallel to the second direction D2 to cross the PMOSFET and NMOSFET regions PR and NR. The sacrificial gate patterns 102 may be arranged spaced apart from each other in the first direction D1. The gate spacers GSP may be formed on both sidewalls of the sacrificial gate pattern 102.

The source/drain regions SD may be formed on the active patterns AP at both sides of the sacrificial gate pattern 102. For example, as shown in FIG. 4A, the formation of the source/drain regions SD may include partially removing upper portions of the active patterns AP or the active fins AF at both sides of the sacrificial gate pattern 102 and performing a selective epitaxial growth process using the active patterns AP, whose upper portions are removed, as a seed layer. The source/drain regions SD may not be formed in portions of the active patterns AP or the active fins AF, which are positioned below the sacrificial gate pattern 102 and are overlapped with the sacrificial gate pattern 102 in a plan view.

The first interlayer insulating layer 110 may be formed on the substrate 100 to cover the sacrificial gate pattern 102. A planarization process may be performed on the first interlayer insulating layer 110 to expose the top surface of the sacrificial gate pattern 102.

Referring to FIGS. 10, 5A, 5B, and 13, the sacrificial gate pattern 102 may be removed to form the gap region 104 between the gate spacers GSP. The gap region 104 may be formed to expose the substrate 100. In example embodiments, the gap region 104 may include the first region 104a exposing the PMOSFET region PR of the substrate 100 and the second region 104b exposing the NMOSFET region NR of the substrate 100. Thereafter, the gate insulating layer GIL may be formed on the first interlayer insulating layer 110 to partially fill the gap region 104.

The first mask pattern M1 may be formed on the gate insulating layer GIL to fill the first region 104a of the gap region 104. The first mask pattern M1 may be formed on the PMOSFET region PR. After the formation of the first mask pattern M1, the first gate electrode layer GEL1 may be formed on the gate insulating layer GIL to fill the remaining space of the second region 104b.

Referring to FIGS. 10, 6A, 6B, and 14, the first mask pattern M1 may be removed. Thereafter, the second mask pattern M2 may be formed on the substrate 100 to cover the first gate electrode layer GEL1. The second mask pattern M2 may be formed on the NMOSFET region NR. The second mask pattern M2 may be formed to expose the gate insulating layer GIL on the PMOSFET region PR and the first region 104a of the gap region 104.

After the formation of the second mask pattern M2, the second gate electrode layer GEL2 may be formed on the gate insulating layer GIL to fill the remaining space of the first region 104a.

Referring to FIGS. 10, 7A, 7B, and 15, the second mask pattern M2 may be removed. Thereafter, a planarization process may be performed on the first and second gate electrode layers GEL1 and GEL2 and the gate insulating layer GIL to expose the top surface of the first interlayer insulating layer 110. As a result of the planarization process, top surfaces of the gate spacers GSP may also be exposed. The planarization process may be performed until the first and second gate electrode layers GEL1 and GEL2 have a desired thickness in the gap region 104. As a result, the first gate electrode GE1 may be formed to cross the NMOSFET region NR, and the second gate electrode GE2 may be formed to cross the PMOSFET region PR. In addition, as a result of the planarization process, the first gate insulating pattern GI1 may be formed under the first gate electrode GE1 and the second gate insulating pattern GI2 may be formed under the second gate electrode GE2. The first gate insulating pattern GI1 may extend in between the first gate electrode GE1 and the gate spacers GSP, and the second gate insulating pattern GI2 may extend in between the second gate electrode GE2 and the gate spacers GSP. The first and second gate insulating patterns GI1 and GI2 may be continuously connected to each other to form a single body.

The planarization process may be performed in such a way that the first gate electrode GE1 and the first gate insulating pattern GI1 have top surfaces coplanar with each other and that the second gate electrode GE2 and the second gate insulating pattern GI2 have top surfaces substantially coplanar with each other. Furthermore, the planarization process may be performed in such a way that the first and second gate electrodes GE1 and GE2 and the first and second gate insulating patterns GI1 and GI2 have top surfaces substantially coplanar with that of the first interlayer insulating layer 110.

The capping pattern CAP may be formed on the first interlayer insulating layer 110. The capping pattern CAP may be formed to cover the top surfaces of the first and second gate electrodes GE1 and GE2, the top surfaces of the first and second gate insulating patterns GI1 and GI2, and the top surfaces of the gate spacers GSP and may be extended to cover the top surface of the first interlayer insulating layer 110.

The first and second gate insulating patterns GI1 and GI2 may constitute the gate insulating pattern GI, and the first and second gate electrodes GE1 and GE2 may constitute the gate electrode GE. The gate spacers GSP may be provided on both sidewalls of the gate electrode GE, and the capping pattern CAP may be provided on the top surface of the gate electrode GE.

The conductive patterns TS may be formed to penetrate the capping pattern CAP and the first interlayer insulating layer 110 at both sides of the gate electrode GE and may be connected to the source/drain regions SD. On the PMOSFET region PR, each of the conductive patterns TS may be formed to connect the source/drain regions SD, which are spaced apart from each other in the second direction D2 by the third device isolation layer ST3 interposed therebetween, to each other. On the NMOSFET region NR, each of the conductive patterns TS may be formed to connect the source/drain regions SD, which are spaced apart from each other in the second direction D2 by the third device isolation layer ST3 interposed therebetween, to each other.

The second interlayer insulating layer 120 may be formed on the structure provided with the conductive patterns TS. The second interlayer insulating layer 120 may be patterned to form the source/drain contact holes H1 exposing the conductive patterns TS, at both sides of the gate electrode GE. Each of the source/drain contact holes H1 may be formed to extend along the top surface of each of the conductive patterns TS. For example, each of the source/drain contact holes H1 may extend in the second direction D2. In some embodiments, at least one of the source/drain contact holes H1 may extend to a region on the device isolation layer ST and may expose the conductive patterns TS on the PMOSFET and NMOSFET regions PR and NR.

Referring to FIGS. 10, 16A, 16B, and 16C, the mask layer M3 may be formed on the second interlayer insulating layer 120 to fill the source/drain contact holes H1. The mask layer M3 and the second interlayer insulating layer 120 may be patterned to form the gate contact hole H2 exposing the top surface of the gate electrode GE. The gate contact hole H2 may be formed spaced apart from the source/drain contact holes H1.

The gate contact hole H2 may include the body hole BH exposing the gate electrode GE and the extended hole EH extending from the body hole BH toward the substrate 100 along one of the sidewalls of the gate electrode GE. The body hole BH and the extended hole EH may be connected to each other.

The formation of the gate contact hole H2 may include performing an etching process having an etch selectivity with respect to the gate electrode GE to pattern the mask layer M3, the second interlayer insulating layer 120, and the capping pattern CAP. During the etching process, an upper portion of the gate electrode GE may be over-etched, and in this case, a bottom surface H2_L1 of the body hole BH may be formed at a lower level than that of the top surface GE_U of the gate electrode GE. In addition, during the etching process, the first interlayer insulating layer 110 may be over-etched at one side of the gate electrode GE. In the case where the etching process is performed using an etching condition having an etch selectivity with respect to the gate electrode GE, an etch rate of the first interlayer insulating layer 110 may be higher than that of the gate electrode GE, during the etching process. Accordingly, as shown in FIG. 16C, the extended hole EH may be formed to have a bottom surface H2_L2 positioned lower than the bottom surface H2_L1 of the body hole BH. In example embodiments, a level or height of the bottom surface H2_L2 of the extended hole EH may be higher than that of the top surface ST_U of the device isolation layer ST and may be lower than that of the top surface AP_U of the active pattern AP or the active fin AF.

The extended hole EH may be spaced apart from the gate electrode GE by the gate spacer GSP interposed therebetween. At least a portion of the first interlayer insulating layer 110 may be interposed between the extended hole EH and the gate electrode GE.

Referring to FIGS. 10, 17A, 17B, and 17C, the mask layer M3 may be removed.

Referring back to FIGS. 10, 11A, 11B, and 11C, a conductive layer may be formed on the second interlayer insulating layer 120 to fill the source/drain contact holes H1 and the gate contact hole H2. A planarization process may be performed on the conductive layer to expose the second interlayer insulating layer 120 and form the source/drain contacts CA and the gate contact CB in the source/drain contact holes H1 and the gate contact hole H2, respectively. As a result of the planarization process, the source/drain contacts CA and the gate contact CB may have the top surfaces CA_U and the top surface CB_U, which are positioned at substantially the same height. The top surfaces CA_U of the source/drain contacts CA and the top surface CB_U of the gate contact CB may be substantially coplanar with the top surface of the second interlayer insulating layer 120.

The interconnection lines may be formed on the substrate 100 and may be electrically connected to the source/drain contacts CA and the gate contact CB. The interconnection lines may be respectively connected to the source/drain regions SD and the gate electrodes GE through the source/drain contacts CA and the gate contact CB, and thus, voltages transmitted from the outside (e.g., from external to the cell) may be applied to the source/drain regions SD and the gate electrodes GE through the interconnection lines.

Figure 18:
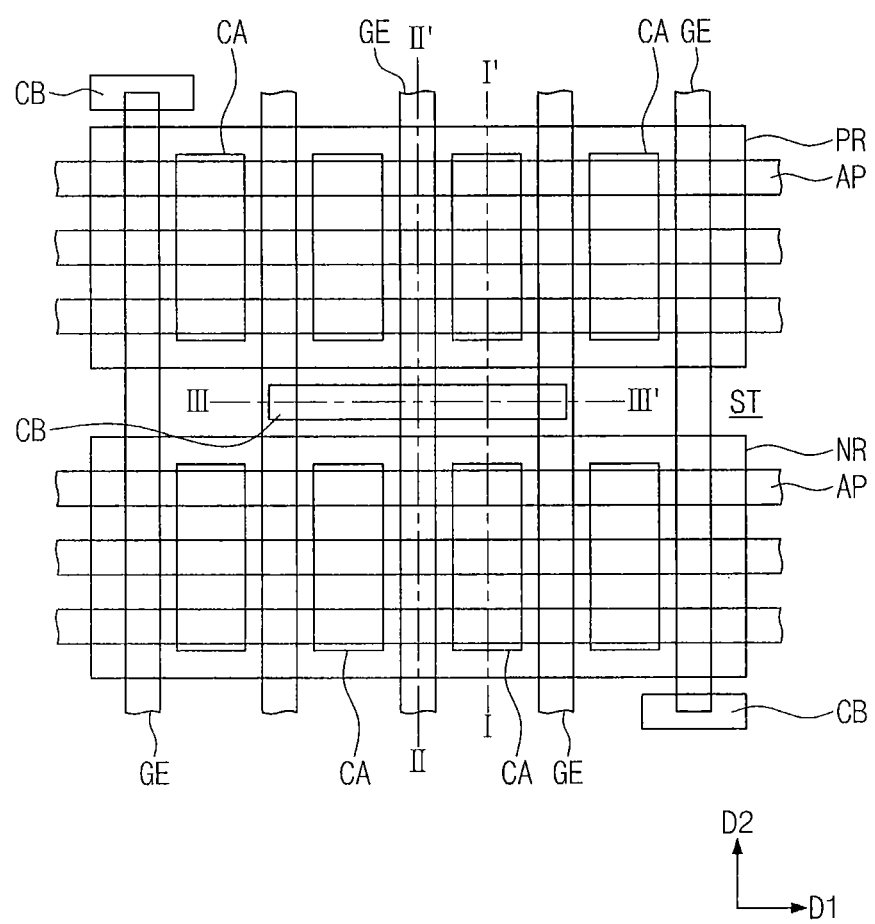
FIG. 18 is a plan view illustrating a portion (e.g., corresponding to the first logic cell C1 of FIG. 1) of a semiconductor device according to some example embodiments of present inventive concepts.
Figure 19A:
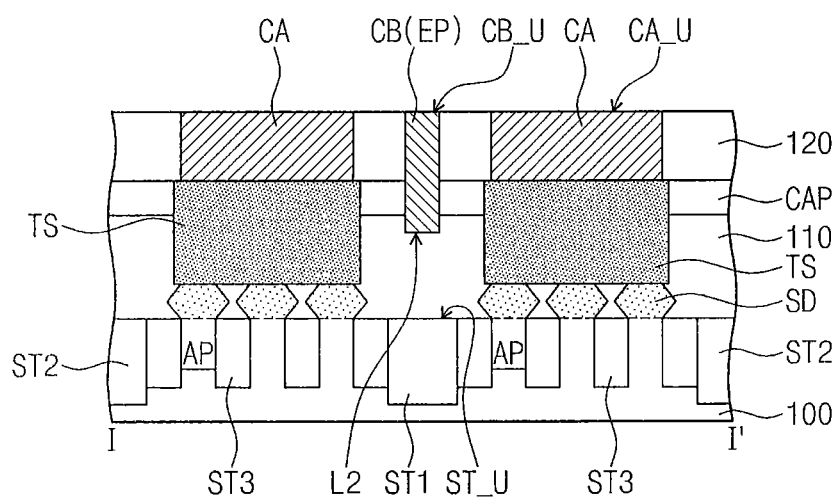
FIGS. 19A, 19B, and 19C are sectional views taken along lines I-I', and III-II', and III-III', respectively, of FIG. 18.
Figure 19B:
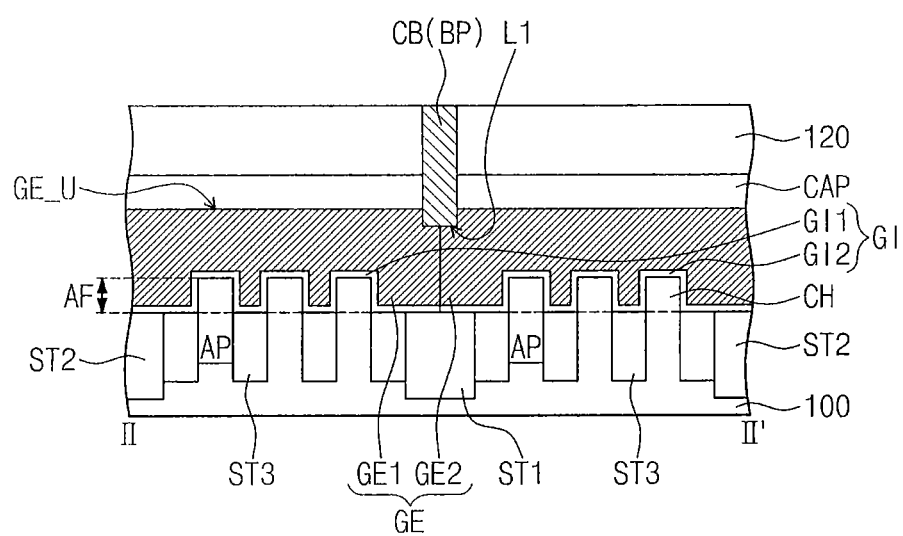
Figure 19C:
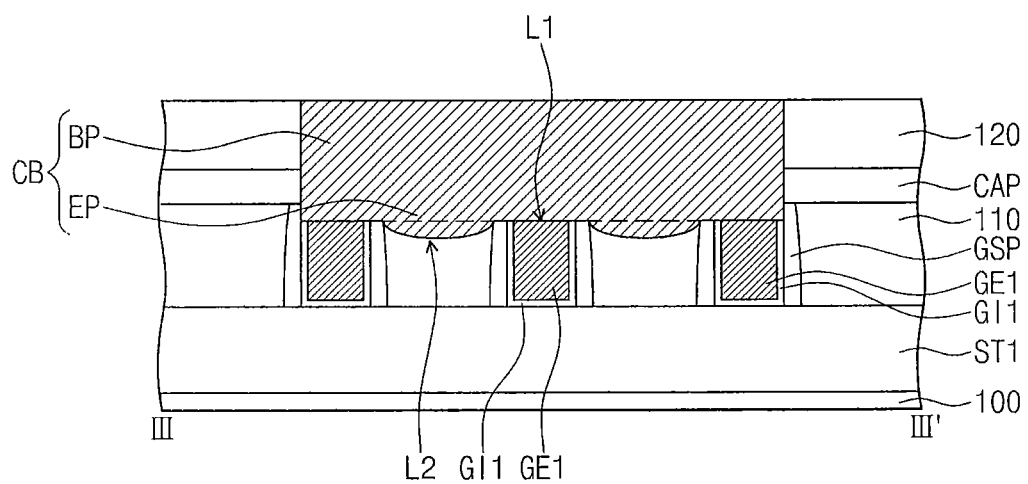
Figure 20:
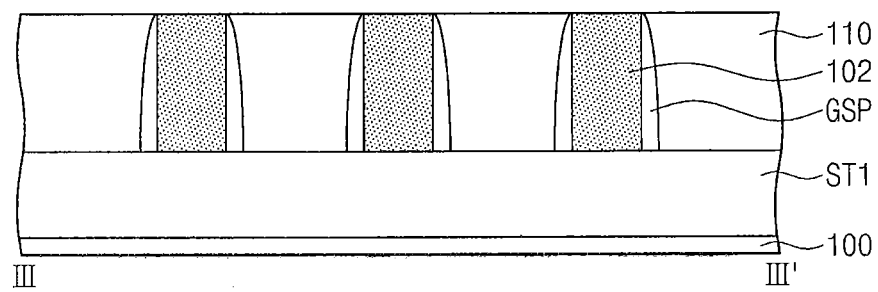
FIGS. 20 through 23, FIGS. 24A through 24C, and FIGS. 25A through 25C are sectional views illustrating a method of fabricating a semiconductor device according to some example embodiments of present inventive concepts.
Figure 21:
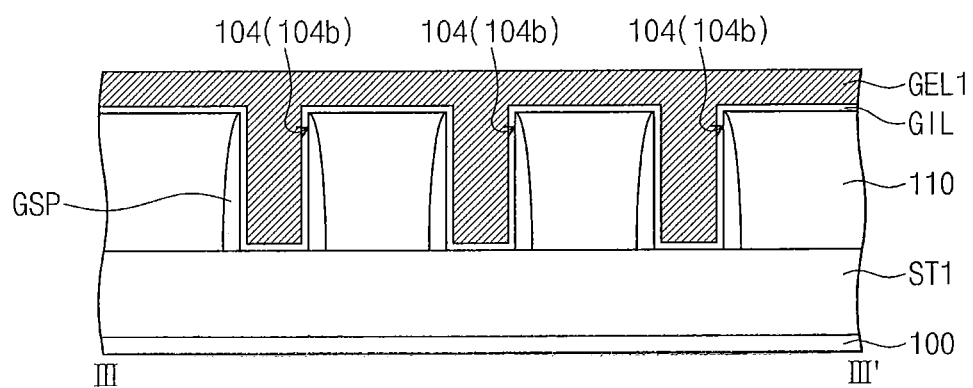
Figure 22:
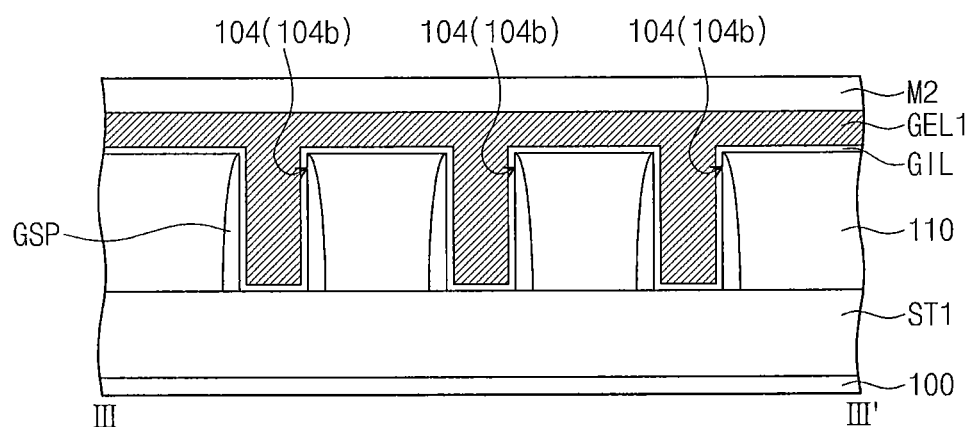
Figure 23:
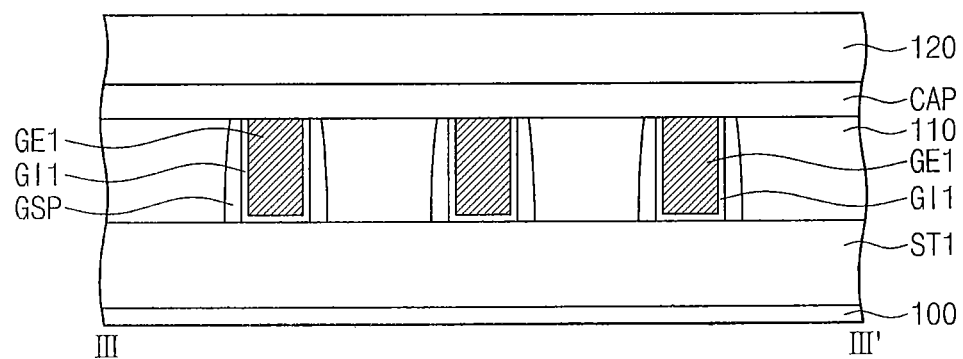

FIG. 18 is a plan view illustrating a portion (e.g., corresponding to the first logic cell C1 of FIG. 1) of a semiconductor device according to some example embodiments of present inventive concepts. FIGS. 19A, 19B, and 19C are sectional views taken along lines I-I', II-II', and III-III', respectively, of FIG. 18. For concise description, an element previously described with reference to FIGS. 2, 3A, 3B, and 3C may be identified by a similar or identical reference number without repeating a duplicative description thereof.

Referring to FIGS. 1, 18, 19A, 19B, and 19C, the gate contact CB may be provided to be electrically connected to a plurality of gate electrodes GE. The gate contact CB may be provided to penetrate the second interlayer insulating layer 120 and may be connected in common to the plurality of gate electrodes GE.

According to some embodiments, the gate contact CB may include the body portion BP and the extended portions EP. The body portion BP is provided to extend in the first direction D1 and be in contact with upper portions of the plurality of gate electrodes GE. Each of the extended portions EP is provided between the plurality of gate electrodes GE and is extended from the body portion BP toward the substrate 100. The extended portions EP may be interposed between the plurality of gate electrodes GE, and the body portion BP and the extended portions EP may be continuously connected to form a single body. As shown in FIG. 19B, a height of the bottom surface L1 of the body portion BP may be lower than that of the uppermost top surface GE_U of each of the gate electrodes GE.

In some example embodiments, the gate contact CB may be provided on the device isolation layer ST positioned between an adjacent pair of the active patterns AP. In this case, between the plurality of gate electrodes GE, the extended portions EP may extend from the body portion BP toward the device isolation layer ST. As an example, the gate contact CB may be provided on the first device isolation layer ST1 positioned between the PMOSFET and NMOSFET regions PR and NR. The gate contact CB may be positioned on the interface between the first and second gate electrodes GE1 and GE2 or on the first or second gate electrode GE1 or GE2. A height of the bottom surface L2 of each of the extended portions EP may be lower than that of the bottom surface L1 of the body portion BP. As shown in FIG. 19A, the height of the bottom surface L2 of each of the extended portions EP may be higher than that of the top surface ST_U of the device isolation layer ST. The gate spacer GSP may be interposed between each of the extended portions EP and the gate electrode GE adjacent thereto.

The top surfaces CA_U of the source/drain contacts CA may be positioned at substantially the same height as that of the top surface CB_U of the gate contact CB. The top surfaces CA_U of the source/drain contacts CA and the top surface CB_U of the gate contact CB may be substantially coplanar with the top surface of the second interlayer insulating layer 120.

The source/drain contacts CA and the gate contact CB may be formed of or include the same material. The gate contact CB may include at least one of doped semiconductors, metals, or conductive metal nitrides.

Figure 24A:
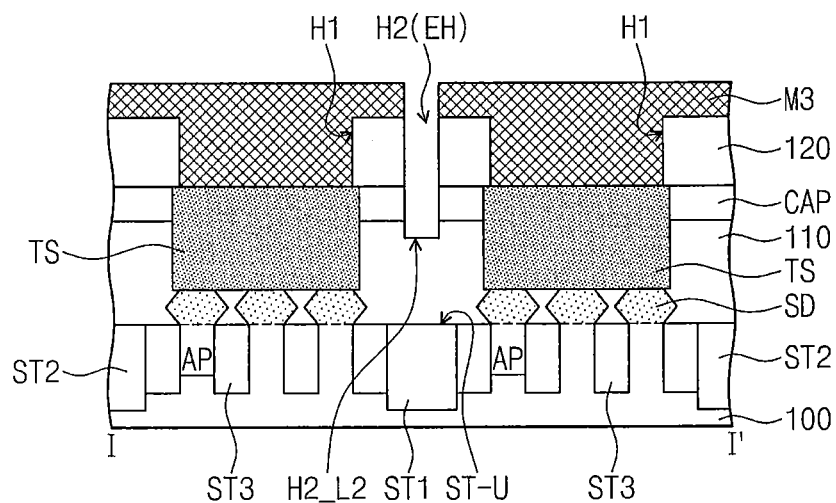
Figure 24B:
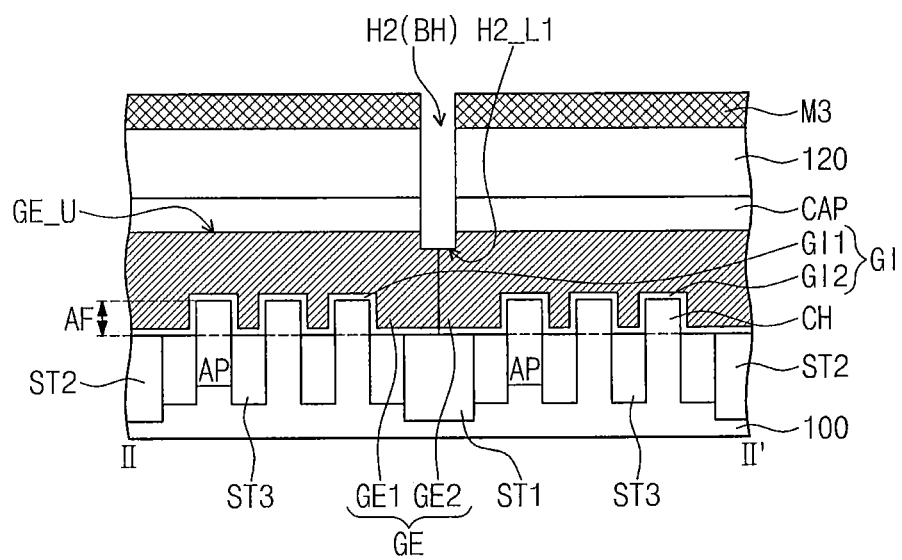
Figure 24C:
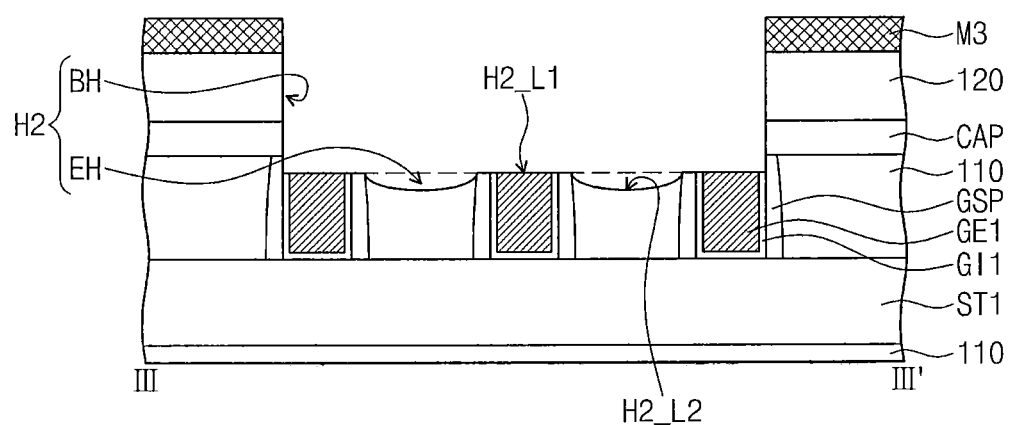
Figure 25A:
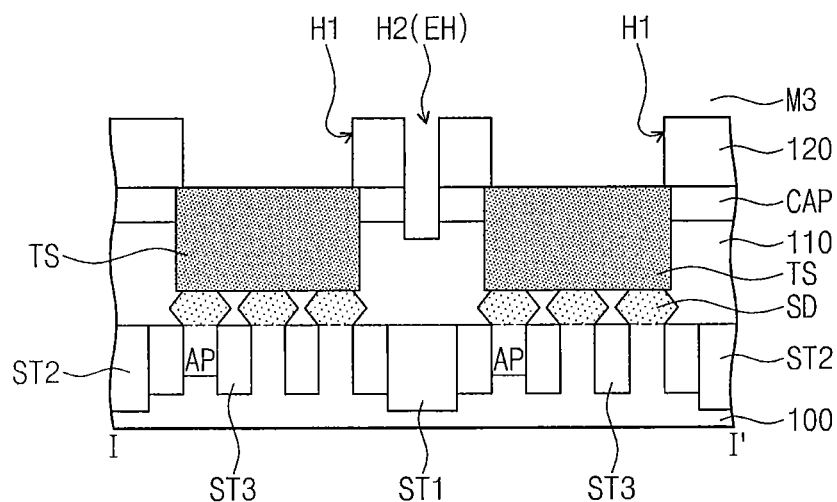
Figure 25B:
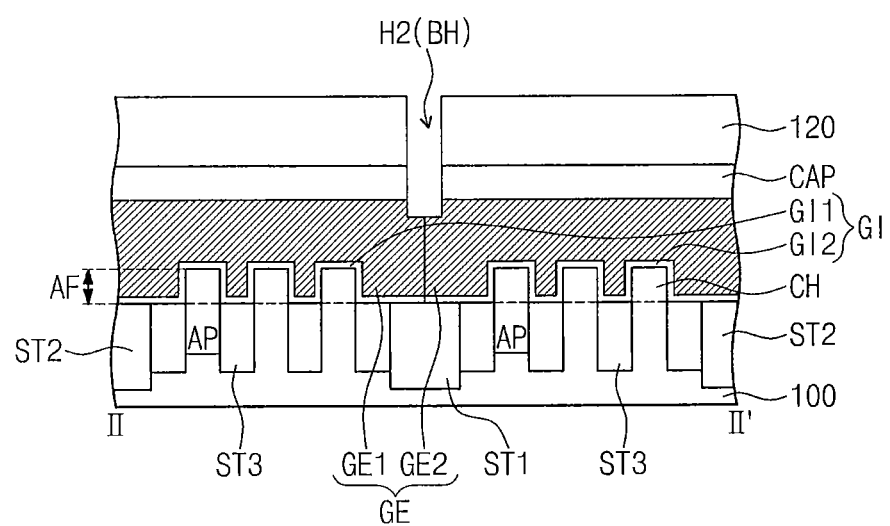
Figure 25C:
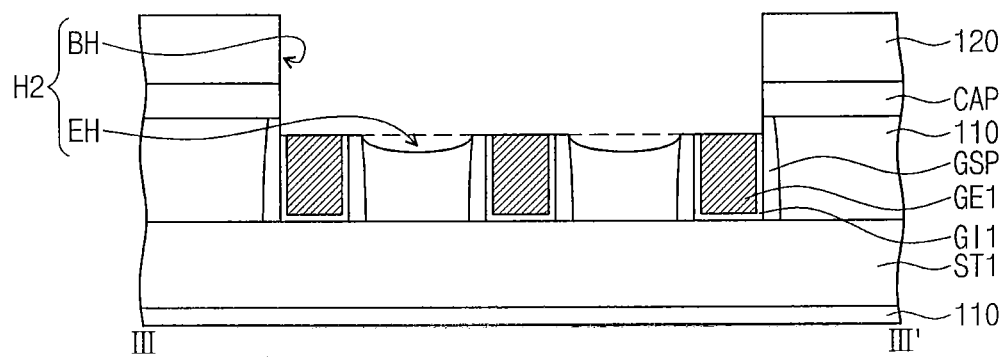

FIGS. 20 through 23, FIGS. 24A through 24C, and FIGS. 25A through 25C are sectional views illustrating a method of fabricating a semiconductor device according to some example embodiments of present inventive concepts. In detail, FIGS. 24A and 25A are sectional views corresponding to line I-I' of FIG. 18, and FIGS. 24B and 25B are sectional views corresponding to line II-II' of FIG. 18. FIGS. 20 through 23, 24C, and 25C are sectional views corresponding to line III-III' of FIG. 18. For concise description, an element or step previously described with reference to FIGS. 4A-9C may be identified by a similar or identical reference number without repeating a duplicative description thereof.

Referring to FIGS. 18, 4A, 4B, and 20, the first device isolation layer ST1 and the second device isolation layer ST2 may be formed on a substrate 100. The first device isolation layer ST1 may be formed to extend in the first direction D1 and separate the PMOSFET region PR of the first logic cell C1 from the NMOSFET region NR of the first logic cell C1. The second device isolation layer ST2 may be formed to extend in the first direction D1 and separate the first logic cell C1 from other logic cells adjacent thereto. The third device isolation layer ST3 may be formed on the substrate 100. The third device isolation layer ST3 may be formed to extend in the first direction D1 and define the active patterns AP in the PMOSFET and NMOSFET regions PR and NR. As an example, each of the active patterns AP may include the upper portion (i.e., the active fin AF) exposed by the third device isolation layer ST3.

The sacrificial gate patterns 102 may be formed on the substrate 100 to cross the active patterns AP and extend in the second direction D2. The sacrificial gate patterns 102 may extend parallel to the second direction D2 to cross the PMOSFET and NMOSFET regions PR and NR. The sacrificial gate patterns 102 may be arranged spaced apart from each other in the first direction D1. The gate spacers GSP may be formed on both sidewalls of the sacrificial gate pattern 102.

The source/drain regions SD may be formed on the active patterns AP at both sides of the sacrificial gate pattern 102. For example, as shown in FIG. 4A, the formation of the source/drain regions SD may include partially removing upper portions of the active patterns AP or the active fins AF at both sides of the sacrificial gate pattern 102 and performing a selective epitaxial growth process using the active patterns AP, whose upper portions are removed, as a seed layer. The source/drain regions SD may not be formed in portions of the active patterns AP or the active fins AF, which are positioned below the sacrificial gate pattern 102 and are overlapped with the sacrificial gate pattern 102 in a plan view.

The first interlayer insulating layer 110 may be formed on the substrate 100 to cover the sacrificial gate pattern 102. A planarization process may be performed on the first interlayer insulating layer 110 to expose the top surface of the sacrificial gate pattern 102.

Referring to FIGS. 18, 5A, 5B, and 21, the sacrificial gate pattern 102 may be removed to form the gap region 104 between the gate spacers GSP. The gap region 104 may be formed to expose the substrate 100. In example embodiments, the gap region 104 may include the first region 104a exposing the PMOSFET region PR of the substrate 100 and the second region 104b exposing the NMOSFET region NR of the substrate 100. Thereafter, the gate insulating layer GIL may be formed on the first interlayer insulating layer 110 to partially fill the gap region 104.

The first mask pattern M1 may be formed on the gate insulating layer GIL to fill the first region 104a of the gap region 104. The first mask pattern M1 may be formed on the PMOSFET region PR. After the formation of the first mask pattern M1, the first gate electrode layer GEL1 may be formed on the gate insulating layer GIL to fill the remaining space of the second region 104b.

Referring to FIGS. 18, 6A, 6B, and 22, the first mask pattern M1 may be removed. Thereafter, the second mask pattern M2 may be formed on the substrate 100 to cover the first gate electrode layer GEL1. The second mask pattern M2 may be formed on the NMOSFET region NR. The second mask pattern M2 may be formed to expose the gate insulating layer GIL on the PMOSFET region PR and the first region 104a of the gap region 104.

After the formation of the second mask pattern M2, the second gate electrode layer GEL2 may be formed on the gate insulating layer GIL to fill the remaining space of the first region 104a.

Referring to FIGS. 18, 7A, 7B, and 23, the second mask pattern M2 may be removed. Thereafter, a planarization process may be performed on the first and second gate electrode layers GEL1 and GEL2 and the gate insulating layer GIL to expose the top surface of the first interlayer insulating layer 110. As a result of the planarization process, the top surfaces of the gate spacers GSP may also be exposed. The planarization process may be performed until the first and second gate electrode layers GEL1 and GEL2 have a desired thickness in the gap region 104. As a result, the first gate electrode GE1 may be formed to cross the NMOSFET region NR, and the second gate electrode GE2 may be formed to cross the PMOSFET region PR. In addition, as a result of the planarization process, the first gate insulating pattern GI1 may be formed under the first gate electrode GE1 and the second gate insulating pattern GI2 may be formed under the second gate electrode GE2. The first gate insulating pattern GI1 may extend in between the first gate electrode GE1 and the gate spacers GSP The second gate insulating pattern GI2 may extend in between the second gate electrode GE2 and the gate spacers GSP. The first and second gate insulating patterns GI1 and GI2 may be continuously connected to each other to form a single body.

The planarization process may be performed in such a way that the first gate electrode GE1 and the first gate insulating pattern GI1 have top surfaces coplanar with each other and that the second gate electrode GE2 and the second gate insulating pattern GI2 have top surfaces substantially coplanar with each other. Furthermore, the planarization process may be performed in such a way that the first and second gate electrodes GE1 and GE2 and the first and second gate insulating patterns GI1 and GI2 have top surfaces substantially coplanar with that of the first interlayer insulating layer 110.

The capping pattern CAP may be formed on the first interlayer insulating layer 110. The capping pattern CAP may be formed to cover the top surfaces of the first and second gate electrodes GE1 and GE2, the top surfaces of the first and second gate insulating patterns GI1 and GI2, and the top surfaces of the gate spacers GSP, and furthermore, it may be extended to cover the top surface of the first interlayer insulating layer 110.

The first and second gate insulating patterns GI1 and GI2 may constitute the gate insulating pattern GI, and the first and second gate electrodes GE1 and GE2 may constitute the gate electrode GE. The gate spacers GSP may be provided on both sidewalls of the gate electrode GE, and the capping pattern CAP may be provided on the top surface of the gate electrode GE.

The conductive patterns TS may be formed to penetrate the capping pattern CAP and the first interlayer insulating layer 110 at both sides of the gate electrode GE and may be connected to the source/drain regions SD. On the PMOSFET region PR, each of the conductive patterns TS may be formed to connect the source/drain regions SD, which are spaced apart from each other in the second direction D2 by the third device isolation layer ST3 interposed therebetween, to each other. On the NMOSFET region NR, each of the conductive patterns TS may be formed to connect the source/drain regions SD, which are spaced apart from each other in the second direction D2 by the third device isolation layer ST3 interposed therebetween, to each other.

The second interlayer insulating layer 120 may be formed on the structure provided with the conductive patterns TS. The second interlayer insulating layer 120 may be patterned to form the source/drain contact holes H1 exposing the conductive patterns TS, at both sides of the gate electrode GE. Each of the source/drain contact holes H1 may be formed to extend along the top surface of each of the conductive patterns TS. For example, each of the source/drain contact holes H1 may extend in the second direction D2. In some embodiments, at least one of the source/drain contact holes H1 may extend to a region on the device isolation layer ST and may expose the conductive patterns TS on the PMOSFET and NMOSFET regions PR and NR.

Referring to FIGS. 18, 24A, 24B, and 24C, the mask layer M3 may be formed on the second interlayer insulating layer 120 to fill the source/drain contact holes H1. The mask layer M3 and the second interlayer insulating layer 120 may be patterned to form the gate contact hole H2 exposing the top surface of the gate electrode GE. The gate contact hole H2 may be formed spaced apart from the source/drain contact holes H1.

The gate contact hole H2 may include the body hole BH and the extended holes EH. The body hole BH is extended in the first direction D1 to expose the plurality of gate electrodes GE. Each of the extended holes EH is formed between the plurality of gate electrodes GE and is extended from the body hole BH toward the substrate 100. The body hole BH and the extended holes EH may be connected to each other.

The formation of the gate contact hole H2 may include performing an etching process having an etch selectivity with respect to the gate electrodes GE to pattern the mask layer M3, the second interlayer insulating layer 120, and the capping pattern CAP. During the etching process, upper portions of the gate electrodes GE may be over-etched, and in this case, the bottom surface H2_L1 of the body hole BH may be formed at a lower level than that of the top surface GE_U of each of the gate electrodes GE. In addition, during the etching process, the first interlayer insulating layer 110 between the gate electrodes GE may be over-etched. In the case where the etching process is performed using an etching condition having an etch selectivity with respect to the gate electrodes GE, an etch rate of the first interlayer insulating layer 110 may be higher than that of the gate electrode GE, during the etching process. Accordingly, as shown in FIG. 24C, each of the extended holes EH may be formed to have the bottom surface H2_L2 positioned at a lower level than the bottom surface H2_L1 of the body hole BH. In example embodiments, a level or height of the bottom surface H2_L2 of each of the extended holes EH may be higher than that of the top surface ST_U of the device isolation layer ST. Each of the extended holes EH may be spaced apart from a neighboring one of the gate electrodes GE by the gate spacer GSP.

Referring to FIGS. 18, 25A, 25B, and 25C, the mask layer M3 may be removed.

Referring back to FIGS. 18, 19A, 19B, and 19C, a conductive layer may be formed on the second interlayer insulating layer 120 to fill the source/drain contact holes H1 and the gate contact hole H2. A planarization process may be performed on the conductive layer to expose the second interlayer insulating layer 120 and form the source/drain contacts CA and the gate contact CB in the source/drain contact holes H1 and the gate contact hole H2, respectively. As a result of the planarization process, the source/drain contacts CA and the gate contact CB may have the top surfaces CA_U and the top surface CB_U, which are positioned at substantially the same height. The top surfaces CA_U of the source/drain contacts CA and the top surface CB_U of the gate contact CB may be substantially coplanar with the top surface of the second interlayer insulating layer 120.

The interconnection lines may be formed on the substrate 100 and may be electrically connected to the source/drain contacts CA and the gate contact CB. The interconnection lines may be respectively connected to the source/drain regions SD and the gate electrodes GE through the source/drain contacts CA and the gate contact CB, and voltages transmitted from the outside (e.g., from external to the cell) may thus be applied to the source/drain regions SD and the gate electrodes GE through the interconnection lines.

According to some example embodiments of present inventive concepts, the gate contact may include a body portion in contact with an upper portion of at least one gate electrode and an extended portion extending from the body portion along at least one of sidewalls of the gate electrode. The body portion of the gate contact may have a bottom surface positioned below the uppermost top surface of the gate electrode. That is, at least a portion of the body portion may be inserted into (e.g., into a recess of) the gate electrode, and this may lead to an increase in contact area between the gate contact and the gate electrode and thereby a reduction in electrical resistance therebetween. Accordingly, a semiconductor device can have an improved resistance property.

In addition, an etching process may be performed, in an over-etch manner, to form a gate contact hole for the gate contact. During such an over-etching process, an etch rate of a first interlayer insulating layer may be higher than that of the gate electrode. This may allow a body hole for the body portion to have a bottom surface lower than a top surface of the gate electrode. In other words, the over-etching process may be performed to increase an exposed area of the gate electrode, and it may thus be possible to increase a contact area between the gate contact and the gate electrode. Furthermore, the over-etching process may be performed to allow an extended hole for the extended portion to have a bottom surface that is positioned between the bottom surface of the body hole and a top surface of a device isolation layer. Accordingly, it may be possible to relatively easily fabricate a semiconductor device in which the gate contact and the gate electrode are in contact with each other with an increased contact area. In other words, the use of the over-etching process may make it relatively easy to fabricate a semiconductor device having low electrical resistance between the gate contact and the gate electrode. Accordingly, it may be possible to relatively easily fabricate a semiconductor device with an improved resistance property.

Although the active patterns AP herein are illustrated to have a fin-shaped structure, the shape of the active patterns AP may be changed in various ways. Moreover, the fin-shaped structure may be referred to herein as a fin-shaped body. For example, each active pattern AP/active fin AF may be referred to as a fin-shaped body that upwardly protrudes from the substrate 100.

Figure 27:
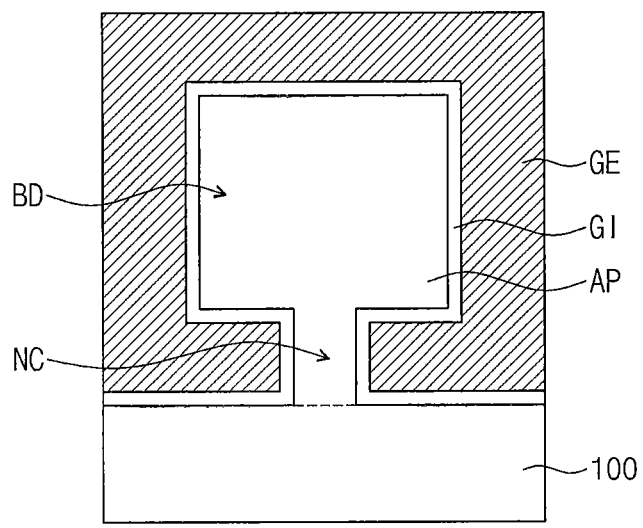
FIG. 27 is a schematic diagram illustrating an active pattern of a semiconductor device according to some example embodiments of present inventive concepts.

FIG. 27 is a schematic diagram illustrating an active pattern of a semiconductor device according to some example embodiments of present inventive concepts. In some embodiments according to FIG. 27, the active pattern AP may be provided to have an omega-shaped section. For example, the active pattern AP may include a neck portion NC adjacent to the substrate 100 and a body portion BD, whose width is larger than that of the neck portion NC. The gate insulating pattern GI and the gate electrode GE may be sequentially provided on the active pattern AP. The gate electrode GE may include at least one portion positioned below the active pattern AP.

Figure 28:
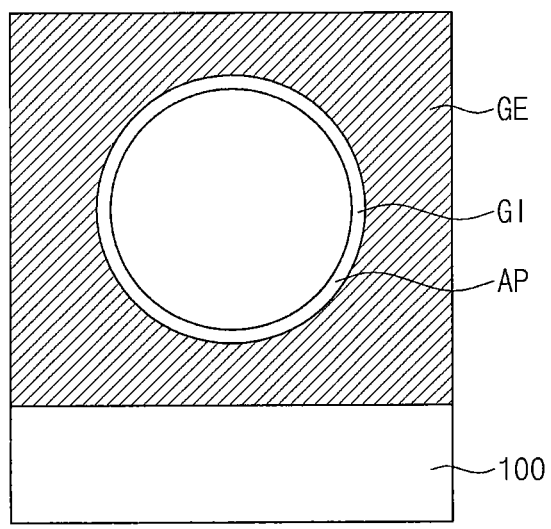
FIG. 28 is a schematic diagram illustrating an active pattern of a semiconductor device according to some example embodiments of present inventive concepts.

FIG. 28 is a schematic diagram illustrating an active pattern of a semiconductor device according to some example embodiments of present inventive concepts. In some embodiments according to FIG. 28, the active pattern AP of the semiconductor device may be provided in the form a nano wire vertically separated from the substrate 100. The gate insulating pattern GI and the gate electrode GE may be sequentially provided on the active pattern AP. The gate electrode GE may include a portion extending in between the active pattern AP and the substrate 100.

Figure 29:
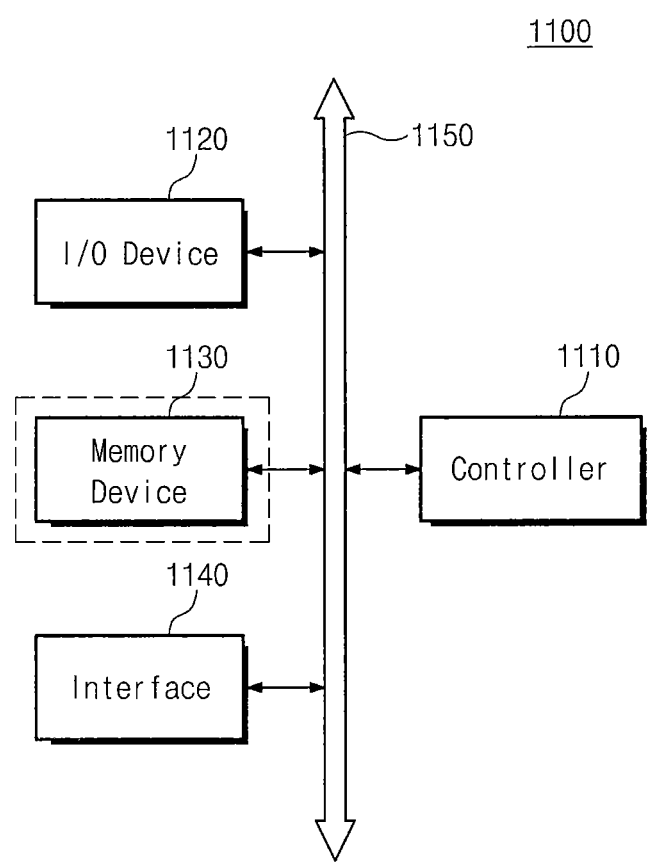
FIG. 29 is a block diagram illustrating an example of an electronic system including a semiconductor device according to some example embodiments of present inventive concepts.

FIG. 29 is a block diagram illustrating an example of an electronic system including a semiconductor device according to some example embodiments of present inventive concepts.

Referring to FIG. 29, an electronic system 1100 according to some example embodiments of present inventive concepts may include a controller 1110, an input/output (I/O) device/unit 1120, a memory device 1130, an interface unit 1140, and a data bus 1150. At least two of the controller 1110, the I/O device 1120, the memory device 1130 and the interface unit 1140 may communicate with each other through the data bus 1150. The data bus 1150 may correspond to a path through which electrical signals are transmitted.

The controller 1110 may include at least one of a microprocessor, a digital signal processor, a microcontroller, or another logic device, which is configured to have a similar function to them. The I/O device 1120 may include a keypad, a keyboard, or a display unit. The memory device 1130 may store data and/or commands. The memory device 1130 may include a nonvolatile memory device (e.g., a FLASH memory device, a phase-change memory device, a magnetic memory device, and so forth). Furthermore, the memory device 1130 may further include a volatile memory device. For example, the memory device 1130 may include a static random access memory (SRAM) device with a semiconductor device according to some example embodiments of present inventive concepts. It may be possible to omit the memory device 1130, depending on the purpose of the electronic system 1100 or a type of an electronic product, for which the electronic system 1100 is used. The interface unit 1140 may transmit electrical data to a communication network or may receive electrical data from a communication network. The interface unit 1140 may operate in a wireless or wired manner. For example, the interface unit 1140 may include an antenna for the wireless communication or a transceiver for the wired and/or wireless communication. A semiconductor device according to some example embodiments of present inventive concepts may be provided as a part of the controller 1110 or the I/O device 1120. In some embodiments, the electronic system 1100 may further include a fast DRAM device and/or a fast SRAM device that acts as a cache memory for improving an operation of the controller 1110.

Figure 30:
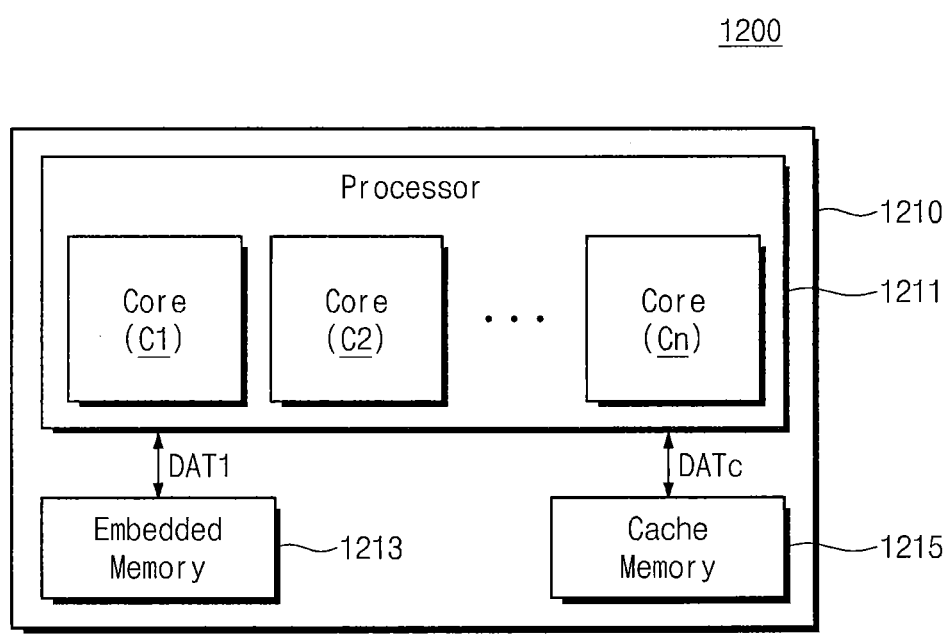
FIG. 30 is a block diagram illustrating an example of an electronic device including a semiconductor device according to some example embodiments of present inventive concepts.

FIG. 30 is a block diagram illustrating an example of an electronic device including a semiconductor device according to some example embodiments of present inventive concepts.

Referring to FIG. 30, an electronic device 1200 may include a semiconductor chip 1210. The semiconductor chip 1210 may include a processor 1211, an embedded memory 1213, and a cache memory 1215.

The processor 1211 may include one or more processor cores C1-Cn. The one or more processor cores C1-Cn may be configured to process data and signals. The processor cores C1-Cn may include a semiconductor device (e.g., including the logic cells described with reference to FIG. 1) according to some example embodiments of present inventive concepts.

The electronic device 1200 may be configured to perform its own functions using the processed data and signals. As an example, the processor 1211 may be an application processor.

The embedded memory 1213 may exchange a first data DAT1 with the processor 1211. The first data DAT1 may be data processed, or to be processed, by the one or more processor cores C1-Cn. The embedded memory 1213 may manage the first data DAT1. For example, the embedded memory 1213 may be configured to perform a buffering operation on the first data DAT1. In other words, the embedded memory 1213 may serve as a buffer or working memory of the processor 1211.

In example embodiments, the electronic device 1200 may be used to realize a wearable electronic device. In general, the wearable electronic device may be configured to perform an operation of calculating a small amount of data, rather than calculating a large amount of data. In this sense, in the case where the electronic device 1200 is used for a wearable electronic device, the embedded memory 1213 may be configured to have a relatively small buffer capacity.

The embedded memory 1213 may be a static random access memory (SRAM) device. The SRAM device may have a faster operating speed than that of a dynamic random access memory (DRAM) device. Accordingly, in the case where the SRAM is embedded in the semiconductor chip 1210, it may be possible for the electronic device 1200 to have a small size and a fast operating speed. Furthermore, in the case where the SRAM is embedded in the semiconductor chip 1210, it may be possible to reduce an active power of the electronic device 1200. In example embodiments, the SRAM may include a semiconductor device according to some example embodiments of present inventive concepts.

The cache memory 1215 may be mounted on the semiconductor chip 1210, along with the one or more processor cores C1-Cn. The cache memory 1215 may be configured to store cache data DATc that will be used or directly accessed by the one or more processor cores C1-Cn. The cache memory 1215 may be configured to have a relatively small capacity and a very fast operating speed. In example embodiments, the cache memory 1215 may include an SRAM device including a semiconductor device according to some example embodiments of present inventive concepts. In the case where the cache memory 1215 is used, it may be possible to reduce an access frequency or an access time to the embedded memory 1213 performed by the processor 1211. In other words, the use of the cache memory 1215 may allow the electronic device 1200 to have a fast operating speed.

To provide better understanding of example embodiments of present inventive concepts, the cache memory 1215 is illustrated to be a component separated from the processor 1211. However, the cache memory 1215 may be configured to be included in the processor 1211.

The processor 1211, the embedded memory 1213, and the cache memory 1215 may be configured to exchange or transmit data, based on at least one of various interface protocols. For example, the processor 1211, the embedded memory 1213, and the cache memory 1215 may be configured to exchange or transmit data, based on at least one of Universal Serial Bus (USB), Small Computer System Interface (SCSI), Peripheral Component Interconnect (PCI) Express, Advanced Technology Attachment (ATA), Parallel ATA (PATA), Serial ATA (SATA), Serial Attached SCSI (SAS), Integrated Drive Electronics (IDE), or Universal Flash Storage (UFS).

Figure 31:
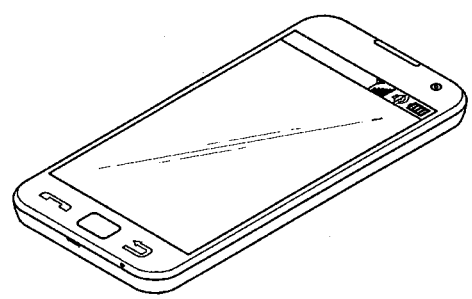
FIGS. 31 through 33 are diagrams illustrating some examples of a multimedia device including a semiconductor device according to some example embodiments of present inventive concepts.
Figure 32:
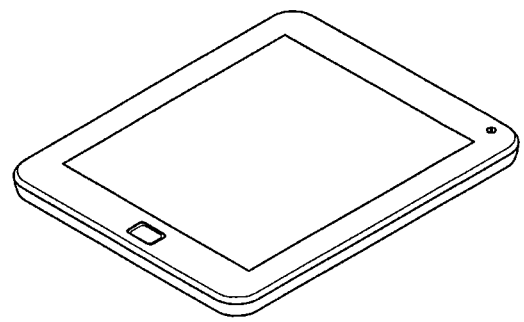
Figure 33:
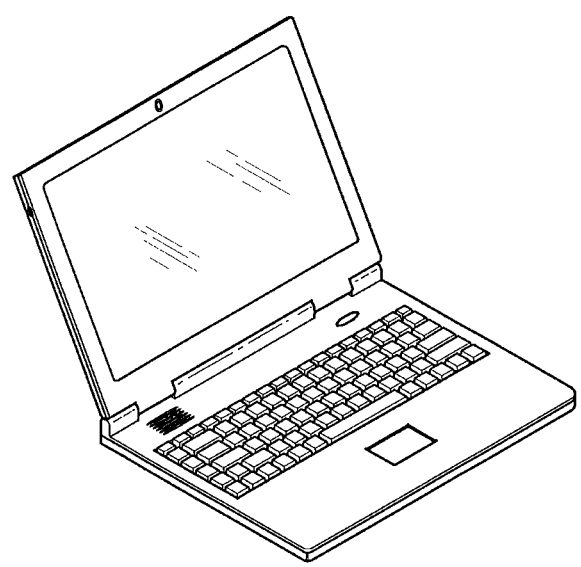

FIGS. 31 through 33 are diagrams illustrating some examples of a multimedia device including a semiconductor device according to some example embodiments of present inventive concepts. The electronic system 1100 of FIG. 29 and/or the electronic device 1200 of FIG. 30 may be applied to a mobile or smart phone 2000 shown in FIG. 31, to a tablet or smart tablet computer (e.g., a tablet/smart tablet personal computer (PC)) 3000 shown in FIG. 32, or to a laptop computer 4000 shown in FIG. 33.

According to some example embodiments of present inventive concepts, the gate contact may include a body portion in contact with an upper portion of at least one gate electrode and an extended portion extending from the body portion along at least one of the sidewalls of the gate electrode. The body portion of the gate contact may have a bottom surface positioned below a top surface of the gate electrode. That is, at least a portion of the body portion may be inserted into the gate electrode, and this may lead to an increase in contact area between the gate contact and the gate electrode and thereby a reduction in electrical resistance therebetween. Accordingly, a semiconductor device can have an improved resistance property.

In addition, an etching process may be performed, in an over-etch manner, to form a gate contact hole for the gate contact. During such an over-etching process, an etch rate of a first interlayer insulating layer may be higher than that of the gate electrode. This may allow a body hole for the body portion to have a bottom surface lower than a top surface of the gate electrode. In other words, the over-etching process may be performed to increase an exposed area of the gate electrode, and it may thus be possible to increase a contact area between the gate contact and the gate electrode. Furthermore, the over-etching process may be performed to allow an extended hole for the extended portion to have a bottom surface that is positioned between the bottom surface of the body hole and a top surface of a device isolation layer. Accordingly, it may be possible to relatively easily fabricate a semiconductor device in which the gate contact and the gate electrode are in contact with each other with an increased contact area. In other words, the use of the over-etching process may make it relatively easy to fabricate a semiconductor device having low electrical resistance between the gate contact and the gate electrode. Accordingly, it may be possible to relatively easily fabricate a semiconductor device with an improved resistance property.

The above-disclosed subject matter is to be considered illustrative, and not restrictive, and the appended claims are intended to cover all such modifications, enhancements, and other embodiments, which fall within the true spirit and scope. Thus, to the maximum extent allowed by law, the scope is to be determined by the broadest permissible interpretation of the following claims and their equivalents, and shall not be restricted or limited by the foregoing detailed description.

What is claimed is:

1. A semiconductor device, comprising:
   a substrate including active patterns defined by a device isolation layer, the active patterns extending along a direction;
   a gate electrode on the active patterns and the device isolation layer; and
   a gate contact on the device isolation layer between the active patterns and connected to the gate electrode,
   wherein the gate contact comprises a body portion in contact with the gate electrode and an extended portion extending from the body portion toward the device isolation layer along a sidewall of the gate electrode.

2. The semiconductor device of claim 1, wherein the body portion has a bottom surface lower than a top surface of the gate electrode.

3. The semiconductor device of claim 1,
   wherein each of the active patterns comprises an active fin exposed by the device isolation layer, and
   wherein the extended portion has a bottom surface lower than a top surface of the active fin.

4. The semiconductor device of claim 3, wherein the bottom surface of the extended portion is at a higher level than a top surface of the device isolation layer.

5. The semiconductor device of claim 1, further comprising a gate spacer provided on the sidewall of the gate electrode,
   wherein at least a portion of the gate spacer is interposed between the sidewall of the gate electrode and the extended portion.

6. The semiconductor device of claim 5, further comprising an interlayer insulating layer adjacent the gate electrode and the gate spacer,
   wherein the gate contact penetrates the interlayer insulating layer and is connected to the gate electrode, and
   wherein at least a portion of the interlayer insulating layer is interposed between the sidewall of the gate electrode and the extended portion.

7. The semiconductor device of claim 5, further comprising a gate insulating pattern between the sidewall of the gate electrode and the gate spacer,
   wherein the gate insulating pattern extends between the gate electrode and the substrate.

8. The semiconductor device of claim 1,
   wherein the extended portion is a first extended portion, and
   wherein the gate contact further comprises a second extended portion extending toward the device isolation layer along an opposite sidewall of the gate electrode.

9. The semiconductor device of claim 8, further comprising gate spacers on both sidewalls of the gate electrode,
   wherein one of the gate spacers is interposed between the first extended portion and the gate electrode, and
   wherein the other one of the gate spacers is interposed between the second extended portion and the gate electrode.

10. The semiconductor device of claim 1, wherein:
    the direction along which the active patterns extend comprises a first direction,
    the active patterns are spaced apart from each other in a second direction that intersects the first direction,
    the gate electrode comprises a plurality of gate electrodes extending in the second direction and spaced apart from each other in the first direction,
    the gate contact extends in the first direction and is connected to each of the plurality of gate electrodes,
    the body portion of the gate contact extends in the first direction and is in contact with the plurality of gate electrodes,
    the extended portion of the gate contact comprises a plurality of extended portions, each extending toward the device isolation layer between the gate electrodes.

11. The semiconductor device of claim 1, further comprising:
    source/drain regions on the active patterns at both sides of the gate electrode; and
    source/drain contacts connected to the source/drain regions,
    wherein the gate contact has a top surface coplanar with top surfaces of the source/drain contacts.

12. A semiconductor device, comprising:
    a gate electrode on a substrate;
    a gate spacer on a sidewall of the gate electrode;
    an interlayer insulating layer adjacent the gate electrode and the gate spacer; and
    a gate contact penetrating the interlayer insulating layer and being connected to the gate electrode,
    wherein the gate contact comprises a body portion in contact with the gate electrode and an extended portion extending toward the substrate along the sidewall of the gate electrode, and
    wherein at least a portion of the gate spacer and at least a portion of the interlayer insulating layer are interposed between the gate electrode and the extended portion of the gate contact.

13. The semiconductor device of claim 12, wherein a bottom surface of the body portion of the gate contact is at a lower level than a top surface of the gate electrode.

14. The semiconductor device of claim 12, further comprising a device isolation layer on the substrate to define an active pattern, wherein the gate electrode extends over the active pattern and the device isolation layer, and wherein the gate contact is on the device isolation layer.

15. A semiconductor device comprising:

a substrate comprising a fin-shaped body protruding therefrom;

a device isolation layer on the substrate;

a gate electrode on the fin-shaped body; and a gate contact that is partially in the gate electrode and partially outside the gate electrode, wherein the gate contact extends between a PMOSFET region of the semiconductor device and an NMOSFET region of the semiconductor device, when viewed in a plan view, and wherein the gate contact comprises a body portion in contact with the gate electrode and an extended portion extending from the body portion toward the device isolation layer along a sidewall of the gate electrode.

16. The semiconductor device of claim 15, wherein the body portion of the gate contact is in a recess of the gate electrode.

17. The semiconductor device of claim 16, wherein the body portion of the gate contact is on three surfaces of the gate electrode.

18. The semiconductor device of claim 16, further comprising an insulating layer, wherein the extended portion of the gate contact is in the insulating layer.

19. The semiconductor device of claim 15, wherein:

the fin-shaped body comprises a first fin-shaped body that is in the PMOSFET region of the semiconductor device;

the semiconductor device further comprises a second fin-shaped body that is in the NMOSFET region of the semiconductor device; and the gate contact extends between the first and second fin-shaped bodies of the PMOSFET and NMOSFET regions, respectively, when viewed in a plan view.

20. The semiconductor device of claim 19, wherein:

the gate electrode comprises a first gate electrode on the first fin-shaped body;

the semiconductor device further comprises a second gate electrode on the second fin-shaped body; and the gate contact overlaps an interface of the first and second gate electrodes.

\* \* \* \* \*